United States Patent
Hashimoto et al.

(10) Patent No.: US 8,518,523 B2
(45) Date of Patent: Aug. 27, 2013

(54) POLYESTER FILM, METHOD FOR MANUFACTURING THE SAME, AND SOLAR CELL MODULE

(75) Inventors: Kiyokazu Hashimoto, Kanagawa (JP); Chiyomi Niitsu, Kanagawa (JP); Natsuki Ooyabu, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 163 days.

(21) Appl. No.: 13/039,670

(22) Filed: Mar. 3, 2011

(65) Prior Publication Data
US 2011/0214720 A1    Sep. 8, 2011

(30) Foreign Application Priority Data
Mar. 4, 2010   (JP) ................. 2010-048421

(51) Int. Cl.
*B29C 47/00* (2006.01)
*B32B 27/08* (2006.01)
*B32B 27/18* (2006.01)
*B32B 27/30* (2006.01)
*B32B 27/36* (2006.01)

(52) U.S. Cl.
USPC ........... 428/215; 428/220; 428/421; 428/447; 428/480; 428/483; 264/176.1

(58) Field of Classification Search
None
See application file for complete search history.

(56) References Cited

U.S. PATENT DOCUMENTS
2011/0209747 A1*   9/2011   Shi ................. 136/251

FOREIGN PATENT DOCUMENTS
JP   2003-060218   2/2003
JP   2007-268710   10/2007

* cited by examiner

*Primary Examiner* — Ramsey Zacharia
(74) *Attorney, Agent, or Firm* — Young & Thompson

(57) ABSTRACT

A polyester film including terminal carboxylic groups in an amount of from 2 eq/t to 23 eq/t, wherein an amount of carboxylic groups on a surface of the film is from 0.005 eq/m² to 0.2 eq/m², and a thickness of the film is from 120 μm to 500 μm.

15 Claims, 1 Drawing Sheet

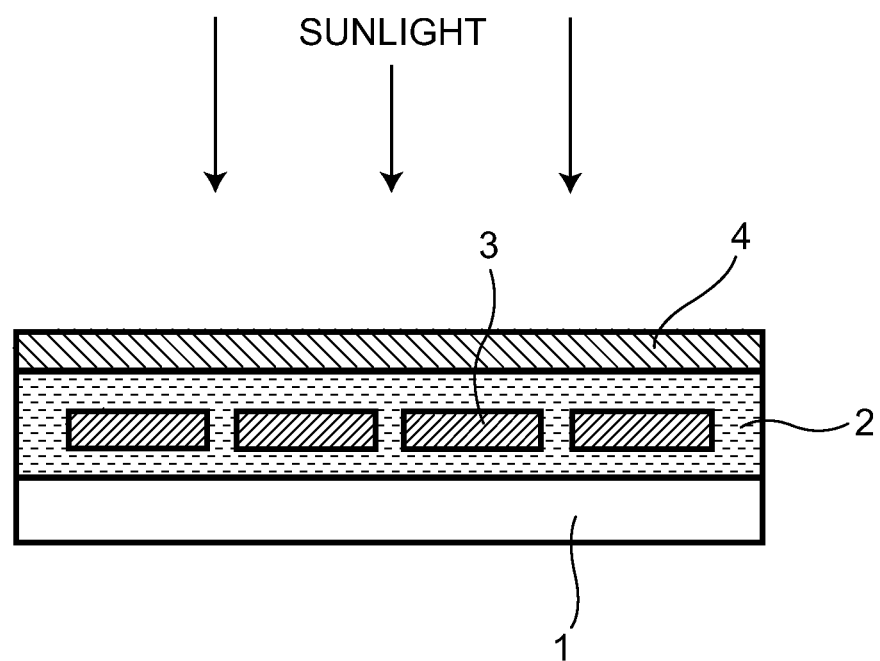

POLYESTER FILM, METHOD FOR MANUFACTURING THE SAME, AND SOLAR CELL MODULE

CROSS-REFERENCE TO RELATED APPLICATION

This application claims priority under 35 USC 119 from Japanese Patent Application No. 2010-048421 filed on Mar. 4, 2010, the disclosure of which is incorporated by reference herein.

BACKGROUND OF THE INVENTION

1. Field of the Invention

The present invention relates to a polyester film, a method for manufacturing the same, and a solar cell module.

2. Description of the Related Art

In recent years, photovoltaic power generation in which sunlight is converted into electricity has drawn attention from the viewpoint of protection of the global environment. A solar cell module for use in the photovoltaic power generation generally has a structure in which (Sealing material)/Solar cell device/Sealing material/Back sheet are disposed in this order on a glass substrate through which sunlight enters.

The solar cell module is required to have high weather resistance so as to maintain the cell performance, such as power generation efficiency, over a long period of time, e.g., several decades, even under severe use environments in which the solar cell module is exposed to wind, rain and direct sunlight. In order to give such weather resistance, various materials, such as a back sheet or a sealing material that seals a device, constituting the solar cell module, are also required to have excellent weather resistance. Moreover, strong weather resistance is required also in the adhesion or the like between these materials, such as between the back sheet and the sealing material (e.g., ethylene-vinyl acetate copolymer (EVA))).

For the back sheet for constituting the solar cell module, resin materials, such as polyester, are generally used. The polyester generally has many carboxyl groups or hydroxyl groups on the surface, and thus is likely to be hydrolyzed in an environment where moisture is present, and tends to remarkably deteriorate with time. Therefore, polyester for use in the solar cell module placed in an environment in which the solar cell module is always exposed to wind and rain, such as outdoors, is required to suppress the hydrolysis properties. However, when reduction in the acid value is tried in order to suppress the hydrolysis properties, the amount of carboxyl groups or hydroxyl groups on the surface of a film is difficult to control in a desired range, e.g., the amount becomes excessively low, which, on the contrary, results in the fact that the adhesion with an adherend is impaired.

As a technique relating to the above description, a technique for suppressing delamination (separation between layers) by adjusting the X ray diffraction intensity ratio (plane orientation) of polyester in a specific range in order to prevent poor adhesion (separation) due to cohesion failure inside a PET film, for example, is disclosed as a method for improving the adhesion when using polyester (e.g., Japanese Patent Application Laid-Open (JP-A) No. 2007-268710).

In addition, a film for sealing the back surface of a solar cell in which a thermal adhesive layer is disposed on a polyester film is disclosed (e.g., JP-A No. 2003-60218).

However, in the polyester film exhibiting a specific X ray diffraction intensity ratio (plane orientation), the hydrolysis of the PET surface due to the elapse of a long period cannot be suppressed, and thus the molecular weight reduces, which results in the fact that the surface embrittles and the adhesion breaks. Similarly also in the film on which the thermal adhesive layer is disposed, the surface embrittles with time and the decomposition with time of the thermal adhesive layer proceeds, and thus, the adhesion reduces.

As described above, in the conventional techniques, the fact is that the adhesion after the elapse of time is still insufficient due to the influences of the hydrolysis properties with respect to the weather resistance over a long period of time, and a further improvement has been desired in the weather resistance over a long period of time.

SUMMARY OF THE INVENTION

According to an aspect of the invention, there is provided a polyester film comprising terminal carboxylic groups in an amount of from 2 eq/t to 23 eq/t, wherein an amount of carboxylic groups on a surface of the film is from 0.005 eq/m$^2$ to 0.2 eq/m$^2$, and a thickness of the film is from 120 µm to 500 µm.

BRIEF DESCRIPTION OF THE DRAWINGS

FIG. 1 is an outline cross sectional view illustrating an example of a structure of a solar cell module.

DETAILED DESCRIPTION OF THE INVENTION

Hereinafter, a polyester film of the invention, a method for manufacturing the same, and a solar cell module using the same will be described in detail.

<Polyester Film and Method for Manufacturing the Same>

A polyester film of the invention comprises terminal carboxylic groups in an amount of from 2 eq/t to 23 eq/t, wherein an amount of carboxylic groups on a surface of the film is from 0.005 eq/m$^2$ to 0.2 eq/m$^2$, and a thickness of the film is from 120 µm to 500 µm.

The polyester film has a tendency that the hydrolysis resistance deteriorates with an increase in the thickness, and thus the film does not withstand long-term use. The hydrolysis resistance can be improved by reducing the amount of the terminal carboxylic groups (terminal COOH), but when reduction in the terminal COOH amount is tried, the amount of the carboxylic groups on the film surface (hereinafter referred to as the "surface COOH amount") is also reduced in accordance with the reduction, and the adhesion force when adhered to an adherend decreases.

In the invention, even when the film has a relatively large film thickness in the range of 120 µm to 500 µm, the adhesion to an adherend can be increased while suppressing the hydrolysis properties to a low degree by adjusting the amount of the terminal carboxylic groups in the polyester forming a film to not 0 but a small amount, and adjusting the film surface so as to have a desired amount of the carboxylic groups in a given range. Thus, the deterioration due to the elapse of a long period of time is suppressed, particularly, the resistance to deterioration (wet heat durability) in a high temperature and humidity environment, is improved. For example, when a solar cell module is constituted, the adhesion to a sealing material or the like is maintained over a long period of time, and desired power generation performance can be stably obtained over a long period of time.

In the polyester film of the invention, the surface COOH amount is increased as described later. Compared with films that have been subjected to surface treatment (corona, glow (plasma), flame, or the like) for adhesion improvement that have been performed conventionally, the film of the invention has high durability so that the film hardly changes even when the film is placed in a moist-heat environment for a long period of time. The surface treatment decomposes the film surface to generate OH groups or COOH groups and increase adhesion but simultaneously therewith the molecules on the film surface are cleaved, and thus poor adhesion is likely to occur due to cohesion failure. When applied to the use required to have high durability under severe conditions in which the film is exposed to various temperature and humidity environments over a long period of time, such as application to a solar cell, conventional polyester films cannot secure sufficient resistance for the use. In contrast, according to the method for increasing the OH groups or the COOH groups on the film surface while reducing the COOH amount of the entire film as in the polyester film of the invention, high adhesion force is obtained in addition to imparting hydrolysis resistance.

The thickness (after the completion of stretching) of the polyester film of the invention is in the range of from 120 μm to 500 μm. When the thickness is in the range above, the thickness of a melt film extruded from a die can be increased (forming a thick film). Therefore, the amount of the carboxylic groups on the film surface (surface COOH amount) described above can be satisfied. In addition, the thickness enables the hydroxyl group amount described later. That is, in the invention, when the film thickness is relatively large as described above, hydrolysis resistance can be increased.

When formed into such a thick film, particularly an effect of improving weather resistance (particularly hydrolysis resistance) is high.

In a thin region where the thickness of the polyester film is lower than 120 μm, the proportion of the surface in the entire film increases and the weather resistance is likely to decrease. Since the hydrolysis proceeds from the surface, the surface molecular weight is first reduced, and then the surface embrittles. When the film thickness is low, the film is likely to be ruptured due to the influence of the embrittlement, and the breaking elongation ratio (before/after) before and after the elapse of a long (thermal treatment) period of time increases. The weather resistance is lower when the ratio is larger. In contrast, when the thickness of the polyester film exceeds 500 μm, the bending elasticity becomes excessively high and cracks arise in the film on a path roll through which the film is made to pass during the film formation. Therefore, the hydrolysis is likely to proceed from the cracks as the starting point, and the breaking elongation after thermal treatment is reduced.

The thickness is preferably in the range of from 150 μm to 450 μm and more preferably from 200 μm to 400 μm for the same reason as above.

The polyester film of the invention contains terminal carboxylic groups in the range of from 2 eq/t to 23 eq/t. In order to increase the weather resistance of the film surface, the weather resistance (hydrolysis resistance) of the entire polyester is improved by the terminal carboxylic group amount (AV). When the terminal carboxylic group amount is lower than 2 eq/t, the amount of the carboxylic groups (COOH groups) on the surface becomes excessively low (polarity becomes excessively low) and the adhesion decreases. Thus, the amount is not preferable. When the terminal carboxylic group amount exceeds 23 eq/t, the hydrolysis resistance of the polyester film decreases and a desired degradation resistance is not obtained. The reduction in the hydrolysis resistance proceeds because H+ of the COOH group at the terminal of a polyester molecule serves as a catalyst and prompts the hydrolysis.

The terminal carboxylic group amount is in the range of preferably from 4 eq/t to 20 eq/t and more preferably from 6 eq/t to 18 eq/t.

The terminal carboxylic group amount is a value calculated from a titer determined by completely dissolving polyester in a mixed benzyl alcohol/chloroform solution (=2/3; volume ratio), and titrating the same with a standard liquid (0.025N KOH-methanol mixed solution) using phenol red as an indicator.

The carboxylic group amount on the surface (the surface COOH amount) of the polyester film of the invention is from 0.005 eq/m$^2$ to 0.2 eq/m$^2$. When the surface COOH amount is in the range of lower than 0.005 eq/m$^2$, the COOH amount is excessively low, and thus the adhesion to a layer containing a sealing material, such as an ethylene-vinyl acetate copolymer (EVA) or the adhesion to an adhesion layer, for example, decreases. Thus, the amount is not preferable. When the surface COOH amount exceeds 0.2 eq/m$^2$, H+ on the film surface serves as a catalyst and prompts hydrolysis, and thus the molecular weight of the polyester reduce and brittleness increases, and then a reduction in adhesion due to cohesion failure occurs.

The surface COOH amount is in the range of preferably from 0.007 eq/m$^2$ to 0.15 eq/m$^2$ and more preferably from 0.01 eq/m$^2$ to 0.1 eq/m$^2$.

The surface COOH amount is a value measured utilizing an X ray photoelectron spectroscopy (XPS) after labeling the COOH groups on the film surface with a fluorine reagent.

In the polyester film of the invention, the OH amount on the film surface (hereinafter abbreviated as "the surface OH amount") is in the range of preferably from 0.05 eq/m$^2$ to 0.3 eq/m$^2$, more preferably from 0.08 eq/m$^2$ to 0.25 eq/m$^2$, and still more preferably from 0.12 eq/m$^2$ to 0.2 eq/m$^2$. When the surface OH amount is 0.05 eq/m$^2$ or more, the OH amount is secured, and thus, the adhesion to a sealing material layer, such as an EVA layer, the adhesion between EVA and the polyester film, or the adhesion to an adhesive layer becomes favorable. When the surface OH amount is 0.3 eq/m$^2$ or lower, excessive hydrophilization of the film surface is suppressed, and the adsorption of water and the occurrence of hydrolysis are suppressed. Thus, embrittlement or cohesion failure due to a reduction in the molecular weight of the polyester is avoided, and then the adhesion to an adherend can be further increased.

The surface OH amount is a value measured utilizing an X ray photoelectron spectroscopy (XPS) after labeling the OH groups on the film surface with a fluorine reagent.

The intrinsic viscosity (IV) of the polyester film can be selected as appropriate according to the purpose and is in the range of preferably from 0.60 to 0.90, more preferably from 0.63 to 0.85, and still more preferably from 0.65 to 0.80. When the IV is 0.60 or more, the molecular weight of the polyester can be maintained in a desired range and favorable adhesion can be obtained at the adhesion interface without cohesion failure. When the IV is 0.90 or lower, the melt viscosity during film formation is favorable, the thermal decomposition of the polyester due to shearing heat generation is suppressed, and the acid value (AV value) can be suppressed to a low degree.

The intrinsic viscosity (IV) is a value obtained by extrapolating a value obtained by dividing the specific viscosity ($\eta_{sp}=\eta_r-1$) obtained by subtracting 1 from the ratio $\eta_r$ ($=\eta/\eta_0$; relative viscosity) of a solution viscosity ($\eta$) and a solvent viscosity ($\eta_0$), by a concentration, so that the concentration becomes 0. The IV is determined from the solution viscosity at 30° C. in a 1,1,2,2-tetrachloroethane/phenol (=2/3 [mass ratio]) mixed solvent.

The polyester film of the invention can be manufactured while controlling the surface COOH amount and the terminal COOH amount by applying the conditions of (1) to (3) described below.

(1) Solid Phase Polymerization

By carrying out an esterification reaction and polymerizing a polyester, and then further carrying out a solid phase polymerization, the IV and the terminal carboxylic group amount (AV) of the polyester film can be adjusted to the range above.

The solid phase polymerization may be carried out by a continuous method (method including putting resin in a heated cylinder, passing the resin through the inside of the cylinder while heating the same and retaining the same for a given period of time, and successively discharging the same) or a batch method (method including putting resin in a container, and stirring the same therein while heating for a given period of time). Specifically, as the solid phase polymerization, the methods described in Japanese Patent Nos. 2621563, 3121876, 3136774, 3603585, 3616522, 3617340, 3680523, 3717392, 4167159, and the like can be used.

The temperature of the solid phase polymerization is preferably from 170° C. to 240° C., more preferably from 180° C. to 230° C., and still more preferably from 190° C. to 220° C. The temperature within the range above is preferable in achieving hydrolysis resistance. The solid phase polymerization time is preferably from 5 hours to 100 hours, more preferably 10 hours to 75 hours, and still more preferably from 15 hours to 50 hours. The time within the range above is preferable in achieving hydrolysis resistance. The solid phase polymerization is preferably performed in a vacuum or under a nitrogen atmosphere.

(2) Extrusion

By melting and kneading resin, extruding the resin from a die, and forming the resin into a film, the surface OH amount and the surface COOH amount of the polyester film can be adjust to the range above. In the process, a preferable kneading temperature is in the range of from 250° C. to 300° C. and the temperature is more preferably from 260° C. to 290° C. and still more preferably from 270° C. to 290° C.

In the process, by further performing the following operation, the surface OH amount and the surface COOH amount can be more preferably adjusted to the range above.

(2-1) The thickness of the molten resin (melt) extruded from the die is set to preferably from 2 mm to 8 mm, more preferably from 2.5 mm to 7 mm, and still more preferably from 3 mm to 6 mm. By increasing the thickness as in the invention, the time required for cooling the extruded melt to a temperature equal to or lower than the glass transition temperature (Tg) can be prolonged. During the process, the OH groups or the COOH groups present on the surface or in the vicinity of the surface of the polyester are diffused into the polyester, so that the surface COOH amount and the surface OH amount can be adjusted to the range above. This is because the air, particularly low-humidity air of 50% RH or lower, is hydrophobic, and thus hydrophilic COOH groups or OH groups are buried in the melt. Therefore, when the thickness of the melt is 8 mm or lower, excessive burying in the melt is suppressed, and then the surface COOH amount or the surface OH amount can be adjusted to be equal to or higher than the lower limit shown above (Surface COOH amount: 0.005 eq/m$^2$, Surface OH amount: 0.05 eq/m$^2$). In contrast, when the thickness of the melt is 2 mm or more, the melt is difficult to be rapidly cooled and a state where the COOH groups or the OH groups can be buried in the melt can be maintained. Therefore, the surface COOH amount or the surface OH amount can be adjusted to be equal to or lower than the upper limit shown above (Surface COOH amount: 0.2 eq/m$^2$, Surface OH amount: 0.3 eq/m$^2$).

In the film formation of such a thick film, a reduction in the cooling rate on a cast (cooling) drum often causes the formation of spherulites, resulting in the fact that stretching unevenness is likely to occur. However, the problems can be solved by imparting, to the cast roll, temperature unevenness of from 0.1° C. to 5° C., more preferably from 0.3° C. to 4° C., and still more preferably from 0.5° C. to 3° C.

Here, the temperature unevenness refers to a difference between the highest temperature and lowest temperature obtained by measuring the temperature of the cast roll along the roll width direction.

When there is a temperature difference as described above, a temperature difference arises in the melt on the cast roll, and expansion/shrinkage stress acts on the melt. When the melt contacts the cast roll, an air layer is involved, and then temperature unevenness is generated. However, when the temperature unevenness in the range above is given, the melt shrinks/expands to eliminate the air layer, and thus adhesion is prompted and cooling is prompted. In contrast, when temperature unevenness exceeding the range above is given, shrinkage unevenness resulting from cooling temperature unevenness during casting arises and deformation is generated in the cast film. Thus, such temperature unevenness is not preferable.

The above temperature distribution and temperature unevenness on the cast roll can be achieved by providing a baffle plate in the roll, passing a heat medium through the inside thereof, and disturbing the flow path.

The cast (unstretched) film thus obtained is stretched by a method described later, so that the thickness is preferably from 120 µm to 500 µm, more preferably from 180 µm to 450 µm, and still more preferably from 200 µm to 400 µm. By forming such a thick film, the surface COOH amount or the surface OH amount described above can be achieved.

(2-2) The humidity in a period (air gap) from extruding the melt (molten resin) from the die to bringing the same into contact with a cooling roll is preferably adjusted to be from 5% RH to 60% RH, more preferably from 10% RH to 55% RH, and still more preferably from 15% RH to 50% RH.

By adjusting the humidity in the air gap to the range above, the surface COOH amount or the surface OH amount can be adjusted to the range above. More specifically, by adjusting the hydrophobicity of the air as described above, burying the COOH groups or the OH groups from the film surface can be controlled.

In the process, the surface OH amount and the surface carboxylic group amount increase by adjusting the humidity to be high and the surface OH amount and the surface carboxylic group amount decrease by adjusting the humidity to be low.

The effects of the air gap particularly affect the surface COOH amount. This is because the polarity of the COOH group is stronger than that of the OH group and is easily affected by the humidity of the air gap.

In the extrusion at such a low humidity, the adhesion to the cast (cooling) drum decreases and cooling unevenness is likely to be generated. However, by imparting a temperature distribution of from 0.1° C. to 5° C. to the cast roll, the cooling unevenness can be reduced as described above.

(2-3) When extruding the molten resin (melt) from the die, the shear rate during the extrusion is preferably adjusted to a desired range. The shear rate during the extrusion is preferably from 1 s$^{-1}$ to 300 s$^{-1}$, more preferably from 10 s$^{-1}$ to 200 s$^{-1}$, and still more preferably from 30 s$^{-1}$ to 150 s$^{-1}$. Thus, when extruded from the die, die swelling (a phenomenon in which the melt swells in the thickness direction) occurs. More specifically, stress acts in the thickness direction (the film normal line), molecule movement in the thickness direction of the melt is promoted and COOH groups and OH groups can be made to be present in the surface COOH group amount range and the surface OH group amount range described above.

When the shear rate is $1\ s^{-1}$ or more, the COOH groups or the OH groups can be sufficiently buried in the melt. When the shear rate is $300\ s^{-1}$ or lower, the COOH groups and the OH groups on the film surface can satisfy the surface COOH amount range and the surface OH group amount range described above.

Due to the influence of the die swelling caused by the extrusion of the molten resin (melt) at such a high shear rate, the melt contacts the die lip and a die line is likely to be generated. Therefore, it is effective to give a fluctuation (pulsation) of preferably from 0.1% to 5%, more preferably from 0.3% to 4%, and still more preferably from 0.5% to 3% to the extrusion amount of the melt.

The die swelling amount also varies in accordance with the fluctuation. In other words, since the contact time of the molten resin (melt) with the die can be suppressed, a continuous die line is not generated. When the fluctuation is in the range above, an increase in deformation resulting from thickness unevenness is suppressed. Such a discontinuous die line can be eliminated by the viscous effect of the melt and does not actually cause any problem. Furthermore, such a die swelling fluctuation also has an effect of fluctuating the stress in the thickness direction to thereby prompt the movement of COOH or OH.

Such a fluctuation of the extrusion amount may be achieved by fluctuating the number of rotation of a screw of an extruder or fluctuating the number of rotation of a gear pump, which is provided between the extruder and the die.

(3) Polymerization of Polyester
—Esterification Reaction—

In the esterification reaction for polymerizing the polyester, polymerization is preferably carried out using a titanium (Ti) compound as a catalyst in an amount of Ti element of from 1 ppm to 30 ppm, more preferably from 2 ppm to 20 ppm, and still more preferably from 3 ppm to 15 ppm. In this case, the polyester film of the invention contains titanium in an amount of from 1 ppm to 30 ppm.

When the Ti amount is 1 ppm or more, the polymerization rate increases and a preferable IV is obtained. When the Ti amount is 30 ppm or lower, the terminal COOH amount can be adjusted to satisfy the range above and a favorable color tone is obtained.

For synthesizing a Ti polyester using a Ti compound, the methods described in JP-B No. 8-30119, Japanese Patent Nos. 2543624, 3335683, 3717380, 3897756, 3962226, 3979866, 3996871, 4000867, 4053837, 4127119, 4134710, 4159154, 4269704, and 4313538, JP-A Nos. 2005-340616, 2005-239940, 2004-319444, and 2007-204538, Japanese Patent Nos. 3436268 and 3780137, and the like can be applied, for example.

Polyester for forming the polyester film of the invention can be obtained by performing an esterification reaction and/or an ester exchange reaction using a known method with (A) a dicarboxylic acid, such as: aliphatic dicarboxylic acids, such as malonic acid, succinic acid, glutaric acid, adipic acid, suberic acid, sebacic acid, dodecanedioic acid, dimer acid, eicosanedioic acid, pimelic acid, azelaic acid, methylmalonic acid, and ethyl malonic acid, alicyclic dicarboxylic acids, such as adamantane dicarboxylic acid, norbornene dicarboxylic acid, isosorbide, cyclohexanedicarboxylic acid, and decalin dicarboxylic acid, and aromatic dicarboxylic acids, such as terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic-acid, 4,4'-diphenyl dicarboxylic acid, 4,4'-diphenyl ether dicarboxylic acid, 5-sodium sulfoisophthalic acid, phenyl indane dicarboxylic acid, anthracene dicarboxylic acid, phenanthrene dicarboxylic acid, and 9,9'-bis(4-carboxyphenyl)fluorene, or an ester derivative thereof, and (B) a diol compound, such as: aliphatic diols, such as ethylene glycol, 1,2-propane diol, 1,3-propane diol, 1,4-butanediol, 1,2-butanediol, and 1,3-butanediol, alicyclic diols, such as cyclohexane dimethanol, spiroglycol, and isosorbide, and aromatic diols, such as bisphenol A, 1,3-benzene dimethanol, 1,4-benzene dimethanol, and 9,9'-bis(4-hydroxyphenyl)fluorene.

As the dicarboxylic acid component, at least one aromatic dicarboxylic acid is preferably used. More preferably, the dicarboxylic acid component contains the aromatic dicarboxylic acid as a main component. The "main component" refer to that the proportion of the aromatic dicarboxylic acid in the dicarboxylic acid component is 80% by mass or more. Dicarboxylic acid component other than the aromatic dicarboxylic acids may also be contained. Examples of such dicarboxylic acid component include ester derivatives of the aromatic dicarboxylic acids and the like.

As diol component, at least one aliphatic diol is preferably used. As the aliphatic diol, ethylene glycol can be contained, and ethylene glycol is preferably contained as a main component. The "main component" refer to that the proportion of the ethylene glycol in the diol component is 80% by mass or more.

The used amount of the aliphatic diol (e.g., ethylene glycol) is preferably in the range of 1.015 to 1.50 mol per 1 mol of the aromatic dicarboxylic acid (e.g., terephthalic acid) and an optional ester derivative thereof. The used amount is in the range of more preferably 1.02 to 1.30 mol and still more preferably 1.025 to 1.10 mol. When the used amount is in the range of 1.015 or more, the esterification reaction favorably proceeds. When the used amount is in the range of 1.50 mol or lower, the generation of diethylene glycol caused by dimerization of ethylene glycol is prevented, for example, and a large number of properties, such as the melting point, glass transition temperature, crystallinity, heat resistance, hydrolysis resistance, and weather resistance, can be favorably maintained.

For the esterification reaction and/or the ester exchange reaction, known conventional reaction catalysts can be used. Examples of the reaction catalysts include alkali metal compounds, alkaline earth metal compounds, zinc compounds, lead compounds, manganese compounds, cobalt compounds, aluminum compounds, antimony compounds, titanium compounds, and phosphorus compounds. In general, in an arbitrary stage before completing the polyester manufacturing process, it is preferable to add an antimony compound, a germanium compound, or a titanium compound as a polymerization catalyst. As such a method, when the germanium compound is taken as an example, it is preferable to add a germanium compound powder as it is.

Among the above, polyethylene terephthalate (PET) and polyethylene-2,6-naphthalate (PEN) are more preferable polyesters and PET is a still more preferable polyester.

As the PET above, a PET obtained by polymerization using one or two or more catalysts selected from a germanium (Ge) catalyst, an antimony (Sb) catalyst, an aluminum (Al) catalyst, and a titanium (Ti) catalyst is preferable, and a PET obtained by polymerization using a Ti catalyst is more preferable.

The Ti catalyst has high reaction activity and can reduce a polymerization temperature. Therefore, the Ti catalyst can suppress particularly the generation of COOH due to thermal decomposition of PET in a polymerization reaction and thus is suitable for adjusting the terminal COOH amount to a given range in the polyester film of the invention.

Examples of the Ti catalyst include oxides, hydroxides, alkoxides, carboxylates, carbonates, oxalates, organic chelated titanium complexes, and halides. As the Ti catalyst, two or more titanium compounds may be used in combination insofar as the effects of the invention are not impaired.

Examples of the Ti catalyst include titanium alkoxides, such as tetra-n-propyl titanate, tetra-1-propyl titanate, tetra-n-butyl titanate, tetra-n-butyl titanate tetramer, tetra-t-butyl titanate, tetracyclohexyl titanate, tetraphenyl titanate, and tetrabenzyl titanate, titanium oxides obtained by hydrolysis of titanium alkoxides, titanium-silicon or zirconium composite oxides obtained by hydrolysis of a mixture of titanium alkoxide and silicon alkoxide or zirconium alkoxide, titanium acetate, titanium oxalate, potassium titanium oxalate, sodium titanium oxalate, potassium titanate, sodium titanate, a titanic acid-aluminum hydroxide mixture, titanium chloride, a titanium chloride-aluminum chloride mixture, titanium acetylacetonato, and organic chelated titanium complexes containing an organic acid as a ligand.

Among the Ti catalysts, at least one kind of the organic chelated titanium complexes containing an organic acid as a ligand can be preferably used. Examples of the organic acid include citric acid, lactic acid, trimellitic acid, and malic acid. In particular, organic chelate complexes containing citric acid or a citric acid salt as a ligand are preferable.

For example, when a chelated titanium complex containing citric acid as a ligand is used, foreign substances, such as particles, are hardly generated, and a polyester resin having favorable polymerization activity and color tone is obtained compared with the case using other titanium compounds. Even when a citric acid chelated titanium complex is used, a polyester resin having favorable polymerization activity and color tone and having few terminal carboxyl groups is obtained by adding the titanium complex in the stage of an esterification reaction compared with the case of adding the titanium complex after the esterification reaction. In this respect, it is presumed that the titanium catalyst also has a catalyst effect on the esterification reaction, and thus the oligomer acid value when the esterification reaction is completed becomes low by adding the titanium catalyst in the esterification stage, and a subsequent condensation polymerization reaction is more efficiently performed, and that a complex containing citric acid as a ligand has higher hydrolysis resistance than that of titanium alkoxide and the like, and thus does not hydrolyze in the esterification reaction process and effectively functions as the catalyst on the etherification reaction and the condensation polymerization reaction while maintaining the original activity.

In general, it is known that the hydrolysis resistance deteriorates when the terminal carboxyl group amount is larger. An increase in the hydrolysis resistance is expected by reducing the terminal carboxyl group amount by the addition method of the invention.

As the citric acid chelated titanium complex, VERTEC AC-420 (trade name) manufactured by Johnson Massey, for example, can be easily obtained as a commercial available item.

The aromatic dicarboxylic acid and the aliphatic diol can be introduced by preparing a slurry containing them, and then continuously supplying the slurry in the esterification reaction process.

In the invention, the polyester resin is preferably produced by a method for manufacturing a polyester resin including an esterification reaction process including polymerizing an aromatic dicarboxylic acid and an aliphatic diol in the presence of a catalyst containing a titanium compound including an organic chelated titanium complex containing organic acid as a ligand, and adding the organic chelated titanium complex, a magnesium compound, and pentavalent phosphoric acid ester not having an aromatic ring as a substituent in this order, and a condensation polymerization process including performing a condensation polymerization reaction of an esterification reaction product generated by the esterification reaction process, thereby generating a condensation polymerization product.

In this case, by setting the addition order in such a manner as to add a magnesium compound and then a specific pentavalent phosphorus compound after an organic chelated titanium complex is made to be present as a titanium compound in the process of the esterification reaction, the reaction activity of the titanium catalyst can be kept at a moderately high degree, static electricity applicability is given by magnesium, and a decomposition reaction in condensation polymerization can be effectively suppressed. As a result, a polyester resin which is hardly colored and has high electrostatic charge applicability and in which yellowing when exposed to a high temperature is improved is obtained.

Thus, a polyester resin can be provided in which coloring during polymerization and coloring during a subsequent molten film formation decrease and a yellow color tone is reduced compared with a conventional antimony (Sb) catalyst-based polyester resin and which has a color tone and transparency equal to those of a germanium catalyst-based polyester resin having a relatively high transparency and has excellent heat resistance. In addition, a polyester resin having high transparency and a reduced yellow color tone is obtained without using a color tone adjusting material, such as a cobalt compound or a coloring material.

The polyester resin can be utilized for uses requiring high transparency (e.g., optical films and industrial lithographic films) and can considerably reduce the cost because there is no necessity of using an expensive germanium catalyst. In addition, the mixing of foreign substances resulting from a catalyst that is likely to occur in an Sb catalyst system is also avoided. Thus, the occurrence of failure or poor quality in a film formation process is reduced and the cost can be reduced by increasing the yield ratio In the above, when mixing the aromatic dicarboxylic acid and the aliphatic diol with the catalyst containing the organic chelated titanium complex which is the titanium compound prior to the addition of the magnesium compound and the phosphorus compound, the organic chelated titanium complex can favorably proceed the esterification reaction because the organic chelated titanium complex has high catalyst activity also in the esterification reaction. In the process, the titanium compound may be added to a mixture of a dicarboxylic acid component and a diol component. Or, a diol component (or a dicarboxylic acid component) may be mixed after mixing a dicarboxylic acid component (or a diol component) and the titanium compound. Or, a dicarboxylic acid component, a diol component, and the titanium compound may be simultaneously mixed. The mixing can be carried out by a known conventional method, but the method is not limited thereto.

It is preferable to provide a process for adding an organic chelated titanium complex which is a titanium compound, a magnesium compound and a pentavalent phosphorus compound as additive agents in this order when carrying out the esterification reaction. In the process, the esterification reaction is made to proceed in the presence of the organic chelated titanium complex, and thereafter the addition of the magnesium compound can be initiated before the addition of the phosphorus compound.

(Phosphorus Compound)

As the pentavalent phosphorus compound, at least one kind of pentavalent phosphoric acid ester not having an aromatic ring as a substituent can be used. Examples of the pentavalent phosphoric acid ester in the invention include trimethyl phosphate, triethyl phosphate, tri-n-butyl phosphate, trioctyl phosphate, tris(triethylene glycol) phosphate, methyl acid phosphate, ethyl acid phosphate, isopropyl acid phosphate, butyl acid phosphate, monobutyl phosphate, dibutyl phosphate, dioctyl phosphate, and triethylene glycol acid phosphate.

Among the pentavalent phosphoric acid esters, phosphoric acid ester [(OR)$_3$—P=O; R=alkyl group having 1 or 2 carbon atoms] having a lower alkyl group having 2 or lower carbon atoms as a substituent is preferable, and specifically trimethyl phosphate and triethyl phosphate are particularly preferable.

In particular, when a chelated titanium complex in which citric acid or a salt thereof is coordinated is used as a titanium catalyst, the polymerization activity and the color tone are favorable in the pentavalent phosphoric acid ester rather than tetravalent phosphoric acid ester, and further the balance of the polymerization activity, the color tone, and the heat resistance can be particularly increased in the case of adding the pentavalent phosphoric acid ester having a substituent having 2 or lower carbon atoms.

The addition amount of the phosphorus compound is preferably an amount that corresponds to P element content of from 50 ppm to 90 ppm. The amount is more preferably from 60 ppm to 80 ppm and still more preferably from 65 ppm to 75 ppm.

(Magnesium Compound)

The static electricity applicability increases by blending a magnesium compound. Coloring is likely to occur in this case, but, in the invention, the coloring is suppressed and an excellent color tone and excellent heat resistance are obtained.

Examples of the magnesium compound include magnesium salts, such as magnesium oxide, magnesium hydroxide, magnesium alkoxide, magnesium acetate, and magnesium carbonate. In particular, magnesium acetate is the most preferable from the viewpoint of solubility in ethylene glycol.

In order to give high static electricity applicability, the addition amount of the magnesium compound may be adjusted so that the amount of Mg element is preferably 50 ppm or more and more preferably from 50 ppm to 100 ppm. The Mg amount is in the range of preferably from 60 ppm to 90 ppm and more preferably from 70 ppm to 80 ppm in view of imparting static electricity applicability.

In the esterification reaction process in the invention, it is preferable to add the titanium compound which is a catalyst component and the magnesium compound and the phosphorus compound as additive agents and perform melt polymerization so that a value Z calculated from Formula (i) below satisfies Formula (ii) below. Here, the P content refers to the amount of phosphorus derived from the entire phosphorus compound including the pentavalent phosphoric acid ester not having an aromatic ring. The Ti content refers to the titanium amount derived from the entire Ti compound including the organic chelated titanium complex. Thus, by selecting the combination of the magnesium compound and the phosphorus compound in the titanium compound containing catalyst system and controlling the addition timing and the addition ratio, a color tone having a reduced yellow color tone is obtained while maintaining the catalyst activity of the titanium compound at a moderately high degree, and heat resistance can be given so that yellowing is difficult to occur even when exposed to a high temperature during the polymerization reaction, a subsequent film formation (during melting), or the like.

$$Z=5\times(\text{P content [ppm]}/\text{P atomic weight})-2\times(\text{Mg content [ppm]}/\text{Mg atomic weight})-4\times(\text{Ti content [ppm]}/\text{Ti atomic weight}) \quad (i)$$

$$0 \leq Z \leq +5.0 \quad (ii)$$

This serves as an index that quantitatively indicates the balance of the three components because the phosphorus compound not only acts on the titanium but interacts with the magnesium compound.

Formula (i) above indicates the amount of phosphorus that can act on the titanium excluding the amount of phosphorus that acts on the magnesium from the total amount of the phosphorus that can react. When the value Z is positive, an excess amount of phosphorus that blocks titanium is present. In contrast, when the value Z is negative, phosphorus for blocking titanium is insufficient. In the reaction, one atom of each of Ti, Mg, and P is not equivalent, and thus weighting is performed by multiplying each mol number in the Formula by a valence.

In the invention, a polyester resin having an excellent color tone and coloring resistance to heat while having reaction activity required for the reaction can be obtained using the titanium compound, the phosphorus compound, and the magnesium compound that do not require special synthesis or the like and that can be obtained at low cost and with ease.

In Formula (ii) above, the case where $+1.0 \leq Z \leq +4.0$ is satisfied is preferable and the case where $+1.5 \leq Z \leq +3.0$ is satisfied is more preferable from the viewpoint of further improving the color tone and coloring resistance to heat in a state where polymerization reaction reactivity is maintained.

Examples of preferable embodiments in the invention include an embodiment in which, before the completion of an esterification reaction, a chelated titanium complex containing citric acid or a citric acid salt as a ligand is added in an amount of Ti element of from 1 ppm to 30 ppm to aromatic dicarboxylic acid and aliphatic diol, a magnesium salt of weak-acid is added in an amount of Mg element of from 60 ppm to 90 ppm (preferably from 70 ppm to 80 ppm) in the presence of the chelated titanium complex, and then, after the addition, pentavalent phosphoric acid ester not containing an aromatic ring as a substituent is further added in an amount of P element of from 60 ppm to 80 ppm (preferably from 65 ppm to 75 ppm).

The esterification reaction can be carried out while removing water or alcohol generated by the reaction to the outside of the system under the conditions where ethylene glycol is refluxed using a multi-stage device in which at least two reactors are connected in series.

The esterification reaction may be performed in one stage or performed while dividing into many stages.

When performing the esterification reaction in one stage, the esterification reaction temperature is preferably 230 to 260° C. and more preferably 240 to 250° C.

When performing the esterification reaction while dividing into many stages, the esterification reaction temperature of a first reaction vessel is preferably 230 to 260° C. and more preferably 240 to 250° C. and the pressure is preferably 1.0 to 5.0 kg/cm² and more preferably 2.0 to 3.0 kg/cm². The esterification reaction temperature of a second reaction vessel is preferably 230 to 260° C. and more preferably 245 to 255° C. and the pressure is preferably 0.5 to 5.0 kg/cm² and more preferably 1.0 to 3.0 kg/cm². When the esterification reaction is carried out while dividing into three or more stages, the conditions of the esterification reaction in an intermediate stage are preferably set to conditions between the conditions of the first reaction vessel and the conditions of a final reaction vessel.

—Condensation Polymerization—

In condensation polymerization, the esterification reaction product generated in the esterification reaction is subjected to a condensation polymerization reaction to generate a condensation polymerization product. The condensation polymerization reaction may be performed in one stage or performed while dividing into many stages.

The esterification reaction product, such as an oligomer, generated in the esterification reaction is subsequently subjected to a condensation polymerization reaction. The condensation polymerization reaction can be preferably carried out by supplying the esterification reaction product to a multi-stage condensation polymerization reaction vessel.

For example, as the condensation polymerization reaction conditions when carried out in three-stage reaction vessels, an embodiment is preferable in which, in a first reaction vessel, the reaction temperature is 255 to 280° C. and more preferably 265 to 275° C. and the pressure is 100 to 10 torr ($13.3 \times 10^{-3}$ to $1.3 \times 10^{-3}$ MPa) and more preferably 50 to 20 ton ($6.67 \times 10^{-3}$ to $2.67 \times 10^{-3}$ MPa), in a second reaction vessel, the reaction temperature is 265 to 285° C. and more preferably 270 to 280° C. and the pressure is 20 to 1 torr ($2.67 \times 10^{-3}$ to $1.33 \times 10^{-4}$ MPa) and more preferably 10 to 3 torr ($1.33 \times 10^{-3}$ to $4.0 \times 10^{-4}$ MPa), and, in a third reaction vessel that is a final reaction vessel, the reaction temperature is 270 to 290° C. and more preferably 275 to 285° C. and the pressure is preferably 10 to 0.1 torr ($1.33 \times 10^{-3}$ to $1.33 \times 10^{-5}$ MPa) and more preferably 5 to 0.5 torr ($6.67 \times 10^{-4}$ to $6.67 \times 10^{-5}$ MPa).

In the invention, by providing the esterification reaction process and the condensation polymerization process, a polyester resin composition containing a titanium atom (Ti), a magnesium atom (Mg), and a phosphorus atom (P) and having a value Z calculated from Formula (i) below satisfying Formula (ii) below can be produced.

$$Z=5\times(\text{P content [ppm]/P atomic weight})-2\times(\text{Mg content [ppm]/Mg atomic weight})-4\times(\text{Ti content [ppm]/Ti atomic weight}) \quad \text{(i)}$$

$$0 \leq Z \leq +5.0 \quad \text{(ii)}$$

In the polyester resin composition, the balance of the three elements of Ti, P, and Mg is appropriately adjusted by satisfying $0 \leq Z \leq +5.0$. Thus, the color tone and the heat resistance (suppression of yellowing under a high temperature) are excellent and high static electricity applicability can be maintained in a state where polymerization reaction reactivity is maintained. In addition, in the invention, a polyester resin having high transparency and having suppressed yellow color tone can be obtained without using color tone adjustment materials, such as a cobalt compound or a coloring material.

As previously described above, Formula (i) above quantitatively indicates the balance of the phosphorus compound, the titanium compound, and the magnesium compound, and indicates the amount of phosphorus that can act on titanium excluding the amount of phosphorus that acts on magnesium from the total amount of phosphorus that can react. When the Z value is 0 or more, i.e., the amount of phosphorus that acts on the titanium is not excessively small, more favorable heat resistance is obtained and, a yellow color tone is suppressed with respect to the color tone of the polyester resin to be obtained, coloring is suppressed also during, for example, film formation (during melting) after polymerization, and a more favorable color tone is obtained while maintaining the catalyst activity (polymerization reaction reactivity) of the titanium at a high degree. When the Z value is +5.0 or lower, i.e., the amount of phosphorus that acts on the titanium is not excessively large, the heat resistance and the color tone of the polyester to be obtained are favorable and the catalyst activity and the productivity are more excellent.

In the invention, the case where Formula (ii) above satisfies $1.0 \leq Z \leq 4.0$ is preferable and the case where Formula (ii) above satisfies $1.5 \leq Z \leq 3.0$ is more preferable for the same reason as above.

The measurement of each element of Ti, Mg, and P can be performed by quantifying each element in PET using a high resolution type high frequency inductive coupling plasma mass spectrometry (HR-ICP-MS, AttoM (trade name) manufactured by SII NanoTechnology Inc.), and calculating the content [ppm] from the obtained results.

The polyester resin composition to be generated preferably satisfies Formula (iii) below.

$$\text{b value when formed into pellets after condensation polymerization} \leq 4.0 \quad \text{(iii)}$$

By forming the polyester resin obtained by carrying out condensation polymerization into pellets, so that the b value of the pellets is 4.0 or lower, the yellow color tone is low and the transparency is excellent. When the b value is 3.0 or lower, the color tone is equal to that of the polyester resin that is polymerized with a Ge catalyst.

The b value serves as an index showing the color tone and is a value measured using ND-101D (trade name, manufactured by Nippon Denshoku Industries Co., Ltd.).

The polyester resin composition preferably satisfies Formula (iv) below.

$$\text{Color tone change rate } [\Delta b/\text{minute}] \leq 0.15 \quad \text{(iv)}$$

In the case where the color tone change rate [$\Delta b$/minute] when the pellets of the polyester resin obtained by carrying out condensation polymerization are melted and held at 300° C. is 0.15 or lower, yellowing when heated can be reduced to a low degree. Thus, when film formation is carried out by extruding using an extruder or the like, a film having less yellowing and excellent color tone can be obtained.

With respect to the color tone change rate, a lower value is preferable and the value is particularly preferably 0.10 or lower.

The color tone change rate serves as an index showing changes in the color due to heat and is a value calculated by the following method.

That is, the polyester resin composition pellets are fed into a hopper of an injection molding device (e.g., EC100NII (trade name), manufactured by Toshiba Machine Co., Ltd.), melted and held in a cylinder (300° C.) while changing the retention time, and then molded into a plate shape. The b value of the plate is measured by ND-101D (trade name, manufactured by Nippon Denshoku Industries Co., Ltd.). The change rate [$\Delta b$/minute] is calculated based on the changes in the b value.

(Additive Agent)

The polyester in the invention can further contain additive agents, such as a photostabilizer or an antioxidant.

To the polyester film of the invention, a photostabilizer is preferably added. When the photostabilizer is contained, ultraviolet ray degradation can be prevented. Examples of the photostabilizer include compounds that absorb light, such as ultraviolet rays, and convert the same into thermal energy or materials that capture radicals generated by optical absorption and decomposition of films or the like and inhibit a decomposition chain reaction.

Preferable examples of the photostabilizer include compounds that absorb light, such as ultraviolet rays, and convert the same into thermal energy. By containing such a photostabilizer in a film, an effect of increasing a partial discharge voltage by the film can be kept at a high degree over a long period of time even when continuously irradiated with ultraviolet rays over a long period of time, and changes in the color tone due to ultraviolet rays, a reduction in the strength, and the like of the film are prevented.

For example, with respect to UV absorbers, organic UV absorbers, inorganic UV absorbers, and combination thereof can be used without being particularly limited insofar as the other properties of the polyester are not deteriorated. The UV absorber is desired to have excellent moist-heat resistance and be uniformly dispersed in a film.

Examples of the UV absorber include organic UV absorbers, such as: UV absorbers, such as a salicylic acid type, a benzophenone type, a benzotriazole type, and a cyanoacrylate type and UV stabilizers, such as a hindered amine UV stabilizer. Specific examples include a salicylic acid type, such as p-t-butylphenyl salicylate or p-octylphenyl salicylate, a benzophenone type, such as 2,4-dihydroxy benzophenone, 2-hydroxy-4-methoxy benzophenone, 2-hydroxy-4-methoxy-5-sulfobenzophenone, 2,2',4, 4'-tetrahydroxy benzophenone, and bis(2-methoxy-4-hydroxy-5-benzoylphenyl)methane, a benzotriazole type, such as 2-(2'-hydroxy-5'-methylphenyl)benzotriazole, 2-(2'-hydroxy-5'-methylphenyl)benzotriazole, and 2,2'-methylenebis[4-(1,1, 3,3-tetramethylbutyl)-6-(2H benzotriazole-2-yl)phenol], a cyanoacrylate type, such as ethyl-2-cyano-3,3'-diphenylacrylate, a triazine type, such as 2-(4,6-diphenyl-1,3,5-triazine-2-yl)-5-[(hexyl)oxy]-phenol, and a hindered amine type, such as bis(2,2,6,6-tetramethyl-4-piperidyl)sebacate, and a dimethyl succinate.1-(2-hydroxyethyl)-4-hydroxy-2,2,6,6-tetramethyl piperidine polycondensate, and, in addition, nickel bis(octylphenyl)sulfide, and 2,4-di.t-butylphenyl-3',5'-di.t-butyl-4'-hydroxy benzoate.

Among these UV absorbers, the triazine UV absorbers are more preferable in that the resistance to repeated ultraviolet absorption is high. These UV absorbers may be added to a film in the form of a UV absorber simple substance as described above or may be introduced in the form in which a monomer having a UV absorption ability is copolymerized with an organic conductive material or a water-insoluble resin.

The content of the photostabilizer in the polyester film is preferably from 0.1% by mass to 10% by mass, more preferably from 0.3% by mass to 7% by mass, and still more preferably from 0.7% by mass to 4% by mass based on the total mass of the polyester film. Thus, a reduction in the molecular weight of the polyester caused by optical degradation over a long period of time can be suppressed, and a reduction in the adhesion resulting from the cohesion failure in the film caused by the reduction in the molecular weight can be suppressed.

The polyester film of the invention can further contain a lubricant (particles), a UV absorber, a coloring material, a heat stabilizer, a nucleating agent (crystallization agent), a flame retardant, and the like as additive agents in addition to the photostabilizer.

The manufacturing of the polyester film of the invention can be preferably carried out by a manufacturing method (a method for manufacturing a polyester film of the invention) comprising at least: a solid phase polymerization process for solid-phase polymerizing a polyester; and a molding process for melting and kneading the solid-phase polymerized polyester and then extruding the polyester from a die, thereby forming a polyester film containing terminal carboxylic groups in an amount of from 2 eq/t to 23 eq/t, wherein an amount of carboxylic groups on a surface of the film is from 0.005 eq/m$^2$ to 0.2 eq/m$^2$, and a thickness of the film is from 120 µm to 500 µm.

The method for manufacturing a polyester film of the invention may further include an esterification process for performing an esterification reaction and/or an ester exchange reaction for synthesizing polyester. Alternatively, in the method, a commercially available polyester that has been already synthesized may be used for the solid phase polymerization process.

The method for manufacturing a polyester film of the invention preferably further has a synthesizing process for synthesizing the polyester for use in the solid phase polymerization process by carrying out an esterification reaction of dicarboxylic acid or an ester derivative thereof and a diol compound in the presence of a titanium catalyst. The details of the dicarboxylic acid and the ester derivative thereof, the diol compound, and the titanium catalyst are as previously described above and preferable embodiments thereof are also the same.

—Solid Phase Polymerization Process—

In the solid phase polymerization process in the invention, polyester is subjected to solid phase polymerization. The solid phase polymerization is preferably performed using polyester that is polymerized by the esterification reaction as described above or a commercially available polyester after formed into small pieces, such as pellets. The solid phase polymerization is preferably performed under the following conditions: at a temperature of from 150° C. to 250° C., more preferably from 170° C. to 240° C., and still more preferably from 190° C. to 230° C. and for a period of time of from 1 hour to 50 hours, more preferably from 5 hours to 40 hours, and still more preferably from 10 hours to 30 hours. The solid phase polymerization is preferably performed in a vacuum or a nitrogen atmosphere.

The solid phase polymerization may be carried out in a batch manner (in which resin is put in a container and stirred therein for a given time under heating) or may be carried in a continuous manner (in which resin is put in a heated cylinder, made to pass through the inside of the cylinder under heating for a given time, and successively discharged).

—Molding Process—

In the molding process, the polyester film previously described above is formed by melting and kneading the polyester after passing through the solid phase polymerization process, and then extruding the polyester from a die (extrusion die). In this process, a polyester film containing terminal carboxylic groups in an amount of from 2 eq/t to 23 eq/t, in which the amount of the carboxylic groups on the film surface is from 0.005 eq/m$^2$ to 0.2 eq/m$^2$ and the thickness is from 120 µm to 500 µm is obtained.

The polyester obtained in the solid phase polymerization process above is dried so that the remaining moisture content is 100 ppm or lower, and then the polyester can be melted using an extruder. The melting temperature is preferably from 250° C. to 320° C., more preferably from 260° C. to 310° C., and still more preferably from 270° C. to 300° C. The extruder may be a single axis type or a multi-axis type. The process is more preferably performed by replacing the inside of the extruder with nitrogen gas so that the generation of terminal COOH due to thermal decomposition can be suppressed.

The molten resin (melt) that has been melted is made to pass through a gear pump, a filter, and the like, and then extruded from an extrusion die. In the process, the molten resin may be extruded as a single layer or a multilayer.

—Cooling and Solidification Process—

The melt extruded from the extrusion die can be solidified using a chill roll (cooling roll). The temperature of the chill roll at this time is preferably from 10° C. to 80° C., more preferably from 15° C. to 70° C., and still more preferably from 20° C. to 60° C. Furthermore, it is preferable to apply static electricity before the melt contacts the chill roll from the viewpoint of increasing the adhesion between the melt and the chill roll and increasing the cooling efficiency. It is also preferable to apply cold air from the surface opposite to the chill roll or bringing a cooling roll into contact therewith for prompting cooling. Thus, even in the case of a thick film (specifically the thickness of the film after stretching of 120 μm or more or 200 μm or more), the film can be effectively cooled.

When cooling is insufficient, spherulites are likely to be generated, which causes stretching unevenness to generate thickness unevenness in some cases.

—Stretching Process—

The polyester film of the invention can be preferably produced by biaxially stretching the produced extruded film (unstretched film) after the process.

Specifically, it is preferable that the unstretched polyester film is led to a roll group heated to a temperature of from 70° C. to 140° C. and is stretched at a stretching ratio of from 3 times to 5 times in the longitudinal direction (lengthwise direction, i.e., the moving direction of the film), and is cooled by a roll group having a temperature of from 20° C. to 50° C. Subsequently, the film is led to a tenter while holding both ends of the film with a clip, and then stretched at a stretching ratio of from 3 times to 5 times in the direction (width direction) perpendicular to the longitudinal direction in an atmosphere heated to a temperature of from 80° C. to 150° C.

The stretching ratio is preferably from 3 times to 5 times in each of the longitudinal direction and the width direction. The area ratio (lengthwise stretching ratio×crosswise stretching ratio) is preferably from 9 times to 15 times. When the area ratio is 9 times or more, the reflectance, covering properties, and film strength of the biaxially-stretched laminated film to be obtained are favorable. When the area ratio is 15 times or lower, breakage during stretching can be avoided.

As a method for performing biaxial stretching, a simultaneous biaxial-stretching method in which stretching in the longitudinal direction and stretching in the width direction are simultaneously performed may be acceptable in addition to a sequential biaxial-stretching method in which stretching in the longitudinal direction and stretching in the width direction are separately performed as described above.

In order to complete crystal orientation of the obtained biaxially stretched film and give flatness and dimensional stability, heat treatment may be subsequently performed in the tenter preferably at a temperature equal to or higher than the glass transition temperature (Tg) of resin serving as raw materials but lower than the melting point (Tm) thereof for from 1 second to 30 seconds, slow cooling is uniformly performed, and the temperature is cooled to room temperature. In general, when the heat treatment temperature (Ts) is low, the thermal shrinkage degree of the film is high. Thus, in order to give high thermal dimensional stability, the heat treatment temperature is preferably high. However, when the heat treatment temperature is set to be excessively high, the oriented crystallinity sometimes decreases, and as a result the formed film sometimes has poor hydrolysis resistance. Therefore, the heat treatment temperature (Ts) of the polyester film of the invention is preferably 40° C.≦(Tm−Ts)≦90° C. The heat treatment temperature (Ts) is set to more preferably 50° C.≦(Tm−Ts)≦80° C. and still more preferably 55° C.≦(Tm−Ts)≦75° C.

The polyester film of the invention can be used as a back sheet for constituting a solar cell module. However, the atmosphere temperature sometimes increases to about 100° C. during the use as a module. Therefore, the heat treatment temperature (Ts) is preferably from 160° C. to Tm−40° C. (Tm−40° C.>160° C.). The Ts is more preferably from 170° C. to Tm−50° C. (Tm−50° C.>170° C.) and still more preferably from 180° C. to Tm−55° C. (Tm−55° C.>180° C.).

As required, 3 to 12% relaxation treatment may be performed in the width direction or in the longitudinal direction.

(Functional Layer)

The polyester film of the invention can be provided with at least one of functional layers, such as an adhesion layer that is easily adhered to an adherend, a UV absorption layer, and a white layer having light reflection properties. For example, the following functional layer may be formed by coating on the polyester film after subjected to uniaxially stretching and/or biaxially stretching. For forming the layer by coating, known coating techniques, such as a roll coating method, a knife edge coating method, a gravure coating method, and a curtain coating method, can be used.

Before forming the layer by coating, surface treatment (flame treatment, corona treatment, plasma treatment, ultraviolet treatment, etc.) may be performed. The layer is also preferably adhered using an adhesive.

—Adhesion Layer—

The polyester film of the invention preferably has the adhesion layer at the side facing a sealing material of a cell side substrate in which a solar cell device is sealed by the sealing material when constituting a solar cell module. By providing the adhesion layer exhibiting adhesiveness to an adherend (e.g., surface of the sealing material of the cell side substrate in which the solar cell device is sealed with the sealing material) containing the sealing material (particularly an ethylene-vinyl acetate copolymer), the back sheet and the adherend (particularly sealing material) can be firmly adhered to each other. Specifically, the adhesion layer preferably has an adhesion force of 10 N/cm or more and preferably 20 N/cm or more with respect to EVA (ethylene-vinyl acetate copolymer) used as the sealing material.

The adhesion layer is required to prevent the separation of the back sheet during the use of a solar cell module and thus preferably has high moisture and heat resistance.

(1) Binder

The adhesion layer in the invention can contain at least one kind of a binder.

Examples of the binder include polyester, polyurethane, acrylic resin, and polyolefin. In particular, acrylic resin and polyolefin are preferable from the viewpoint of durability. As the acrylic resin, an acryl-silicone composite resin is also preferable. Examples of a preferable binder include the following substances.

Examples of the polyolefin include CHEMIPEARL S-120 and S-75N (trade names, both manufactured by Mitsui Chemicals, Inc.). Examples of the acrylic resin include JURYMER ET-410 and SEK 301 (trade names, both manufactured by Nihon Junyaku Co., Ltd.). Examples of the acryl-silicone composite resin include CERANATE WSA1060 and WSA1070 (trade names, both manufactured by DIC Corporation) and H7620, H7630, and H7650 (trade names, all manufactured by Asahi Kasei Chemicals Corporation).

The amount of the binder is preferably in the range of 0.05 to 5 g/m$^2$ and particularly preferably in the range of 0.08 to 3 g/m$^2$. When the binder amount is 0.05 g/m$^2$ or more, favorable adhesion is obtained. When the binder amount is 5 g/m$^2$ or lower, a favorable surface condition is obtained.

(2) Particles

The adhesion layer in the invention can contain at least one kind of particles. The adhesion layer preferably contains particles in a proportion of 5% by mass or more based on the mass of the entire layer.

Preferable examples of the particles include inorganic particles, such as silica, calcium carbonate, magnesium oxide, magnesium carbonate, and tin oxide. Particularly, among the above, particles of tin oxide and silica are preferable in that a reduction in adhesion is low when exposed to a moist-heat atmosphere.

The particle diameter of the particles is preferably about 10 to 700 nm and more preferably about 20 to 300 nm. By the use of particles having a particle diameter in the range above, favorable adhesion properties can be obtained. The shape of the particles is not particularly limited and particles having a spherical shape, an amorphous shape, and a needle-like shape can be used.

The addition amount of the particles in the adhesion layer is preferably 5 to 400% by mass and more preferably 50 to 300% by mass based on the content of the binder in the adhesion layer. When the addition amount of the particles is 5% by mass or more, the adhesion when exposed to a moist-heat atmosphere is excellent. When the addition amount of the particles is 400% by mass or lower, the surface condition of the adhesion layer is more favorable.

(3) Crosslinking Agent

The adhesion layer in the invention can contain at least one kind of a crosslinking agent.

Examples of the crosslinking agent include crosslinking agents, such as an epoxy crosslinking agent, an isocyanate crosslinking agent, a melamine crosslinking agent, a carbodiimide crosslinking agent, and an oxazoline crosslinking agent. Among the above, an oxazoline crosslinking agent is particularly preferable from the viewpoint of securing the adhesion after time has passed in a moist-heat atmosphere.

Specific examples of the oxazoline crosslinking agent include 2-vinyl 2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl 2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinyl cyclohexane) sulfide, and bis-(2-oxazolinyl norbornane)sulfide. Furthermore, (co)polymers of these compounds can also be preferably utilized.

Examples of compounds having an oxazoline group include EPOCROS K2010E, K2020E, K2030E, WS500, and WS700 (trade names, all manufactured by Nippon Shokubai Kagaku Kogyo Co., Ltd.).

A preferable addition amount of the crosslinking agent in the adhesion layer is preferably 5 to 50% by mass and more preferably 20 to 40% by mass based on the content of the binder in the adhesion layer. When the addition amount of the crosslinking agent is 5% by mass or more, favorable crosslinking effects are obtained and a reduction in the strength or poor adhesion of a reflective layer is difficult to occur. When the addition amount of the crosslinking agent is 50% by mass or lower, the pot life of a coating liquid can be kept longer.

(4) Additive Agent

To the adhesion layer in the invention, known mat agents, such as polystyrene, polymethyl methacrylate, and silica, and known surfactants, such as anionic surfactants and nonionic surfactants, may be added as required.

(5) Method for Forming Adhesion Layer

Examples of a method for forming the adhesion layer of the invention include a method including adhering a polymer sheet having adhesion properties to a polyester film or a coating method. The coating method is preferable in that the layer can be formed with ease and in the form of a thin film having high uniformity. As the coating method, known methods, such as gravure coater or bar coater, can be utilized. As a solvent of a coating liquid for use in the coating, water may be acceptable and an organic solvent, such as toluene or methylethylketone, may be acceptable. The solvents may be used singly or as a mixture of two or more kinds thereof.

(6) Physical Properties

The thickness of the adhesion layer in the invention is not particularly limited and is generally in the range of preferably 0.05 to 8 μm and more preferably 0.1 to 5 μm. When the thickness of the adhesion layer is 0.05 μm or more, required adhesion properties are easily obtained. When the thickness of the adhesion layer is 8 μm or lower, the surface condition can be more favorably maintained.

The adhesion layer in the invention preferably has transparency from the viewpoint of not impairing the effects of a colored layer (particularly reflective layer) when the colored layer is disposed between the adhesion layer and the polyester film.

—UV Absorption Layer—

The polyester film of the invention may be provided with a UV absorption layer containing a UV absorber as described above. The UV absorption layer can be disposed at an arbitrary position on the polyester film.

The UV absorber is preferably dissolved or dispersed with ionomer resin, polyester resin, urethane resin, acrylic resin, polyethylene resin, polypropylene resin, polyamide resin, vinyl acetate resin, cellulose ester resin, or the like for use, and the transmittance of light of 400 nm or lower is adjusted to be 20% or lower.

—Colored Layer—

The polyester film of the invention can be provided with a colored layer. The colored layer is a layer disposed through another layer or directly on the surface of the polyester film, and can be constituted using a pigment or a binder.

The first function of the colored layer is to increase the power generation efficiency of a solar cell module by reflecting light, among incident lights, that reaches the back sheet without being used for power generation in a solar cell, and returning the light to the solar cell. The second function thereof is to improve the decorativeness of the appearance when a solar cell module is viewed from the front surface side. In general, when the solar cell module is viewed from the front surface side, the back sheet is visible in the circumference of a solar cell, and the decorativeness can be increased by providing the colored layer to the back sheet.

(1) Pigment

The colored layer in the invention can contain at least one kind of a pigment.

The pigment is preferably contained in the range of 2.5 to 8.5 g/m². A more preferable content of the pigment in the colored layer is in the range of 4.5 to 7.5 g/m². When the content of the pigment is 2.5 g/m² or more, a required colored state is easily obtained, and the reflectance of light or decorativeness can be made more excellent. When the content of the pigment is 8.5 g/m² or lower, the surface condition of the colored layer can be more favorably maintained.

Examples of the pigment include inorganic pigments, such as titanium oxide, barium sulfate, silicon oxide, aluminum oxide, magnesium oxide, calcium carbonate, kaolin, talc, ultramarine, Prussian blue, and carbon black and organic pigments, such as phthalocyanine blue and phthalocyanine green. Among these pigments, a white pigment is preferable from the viewpoint of constituting the colored layer as a reflective layer that reflects the entering sunlight. Examples of the white pigments include titanium oxide, barium sulfate, silicon oxide, aluminum oxide, magnesium oxide, calcium carbonate, kaolin, and talc.

The average particle diameter of the pigment is preferably 0.03 to 0.8 μm and more preferably about 0.15 to 0.5 μm. When the average particle diameter is in the range above, the light reflection efficiency may be satisfactory.

When the colored layer is constituted as the reflective layer that reflects the entering sunlight, a preferable addition amount of the pigment in the reflective layer cannot be generally determined because the preferable amount varies depending on the type or average particle diameter of the pigment to be used, but the amount is preferably 1.5 to 15 g/m² and more preferably about 3 to 10 g/m². When the addition amount is 1.5 g/m² or more, a required reflectance is easily obtained. When the addition amount is 15 g/m² or low, the strength of the reflective layer can be maintained at a higher degree.

(2) Binder

The colored layer in the invention can contain at least one kind of a binder.

The amount of the binder in the colored layer when the binder is included is in the range of preferably 15 to 200% by mass and more preferably 17 to 100% by mass based on the content of the pigment. When the binder amount is 15% by mass or more, the strength of the colored layer can be more favorably maintained. When the binder amount is 200% by mass or lower, sufficient reflectance or decorativeness may be obtained.

Examples of a binder suitable for the colored layer include polyester, polyurethane, acrylic resin, and polyolefin. As the binder, acrylic resin and polyolefin are preferable from the viewpoint of durability. As the acrylic resin, an acryl-silicone composite resin is also preferable. Examples of a preferable binder include the following substances.

Examples of the polyolefin include CHEMIPEARL S-120 and S-75N (trade names, both manufactured by Mitsui Chemicals, Inc.). Examples of the acrylic resin include JURYMER ET-410 and SEK 301 (trade names, both manufactured by Nihon Junyaku Co., Ltd.). Examples of the acryl-silicone composite resin include CERANATE WSA1060 and WSA1070 (trade names, both manufactured by DIC Corporation) and H7620, H7630, and H7650 (trade names, all manufactured by Asahi Kasei Chemicals Corporation).

(3) Additive Agent

To the colored layer in the invention, a crosslinking agent, a surfactant, a filler, and the like may be added, as required, in addition to the binder and the pigment.

Examples of the crosslinking agent include crosslinking agents, such as an epoxy crosslinking agent, an isocyanate crosslinking agent, a melamine crosslinking agent, a carbodiimide crosslinking agent, and an oxazoline crosslinking agent. The addition amount of the crosslinking agent in the colored layer is preferably 5 to 50% by mass and more preferably 10 to 40% by mass based on the content of the binder in the colored layer. When the addition amount of the crosslinking agent is 5% by mass or more, favorable crosslinking effects can be obtained and the strength or the adhesion of the colored layer can be maintained at a high degree. When the addition amount of the crosslinking agent is 50% by mass or lower, the pot life of a coating liquid can be maintained for a longer time.

Examples of the surfactant include known anionic surfactants and nonionic surfactants. The addition amount of the surfactant is preferably 0.1 to 15 mg/m² and more preferably 0.5 to 5 mg/m². When the addition amount of the surfactant is 0.1 mg/m² or more, cissing is effectively suppressed. When the addition amount of the surfactant is 15 mg/m² or more, the adhesion is excellent.

To the colored layer, a filler, such as silica, may be added in addition to the pigment. The addition amount of the filler is preferably 20% by mass or lower and more preferably 15% by mass or lower based on the content of the binder in the colored layer. By containing the filler, the strength of the colored layer can be increased. When the addition amount of the filler is 20% by mass or lower, the pigment ratio can be maintained, and thus favorable light reflection properties (reflectance) and decorativeness are obtained.

(4) Method for Forming Colored layer

Examples of a method for forming the colored layer of the invention include a method including adhering a polymer sheet containing a pigment to a polyester film, a method including co-extruding the colored layer during the formation of the polyester film, and a coating method. The coating method is preferable in that the layer can be formed with ease and in the form of a thin film having high uniformity. As the coating method, known methods, such as gravure coater or bar coater, can be utilized. As a solvent of a coating liquid for use in the coating method, water may be acceptable and an organic solvent, such as toluene or methylethylketone, may be acceptable. However, it is preferable to use water as a solvent from the viewpoint of an environmental load.

The solvents may be used singly or as a mixture of two or more kinds thereof.

(5) Physical Properties

The colored layer is preferably constituted as a white layer (light reflection layer) containing a white pigment. The reflectance of 550 nm light in the case of the reflective layer is preferably 75% or more. When the reflectance is 75% or more, the sunlight that passes through a solar cell and is not used for power generation can be returned to the cell, and thus an effect of increasing the power generation efficiency is high.

The thickness of the white layer (light reflection layer) is preferably 1 to 20 μm, more preferably 1 to 10 μm, and still more preferably about 1.5 to 10 μm. When the film thickness is 1 μm or more, required decorativeness and reflectance are easily obtained. When the film thickness is 20 μm or lower, satisfactory surface condition may be obtained.

—Undercoat Layer—

To the polyester film of the invention, an undercoat layer can be provided. The undercoat layer can be provided between the colored layer and the polyester film, for example, when the colored layer is provided. The undercoat layer can be constituted using a binder, a crosslinking agent, a surfactant, and the like.

Examples of binder contained in the undercoat layer include polyester, polyurethane, acrylic resin, and polyolefin. To the undercoat layer, crosslinking agents, such as an epoxy crosslinking agent, an isocyanate crosslinking agent, a melamine crosslinking agent, a carbodiimide crosslinking agent, or an oxazoline crosslinking agent, a surfactant, such as an anionic surfactant or a nonionic surfactant, and a filler, such as silica, may be added in addition to the binder.

Methods for forming the undercoat layer by coating or solvents of a coating liquid to be used are not particularly limited.

As the coating method, a gravure coater or a bar coater can be utilized, for example. The solvents may be water or may be organic solvents, such as toluene or methyl ethyl ketone. The solvents may be used singly or as a mixture of two or more kinds thereof.

The coating may be performed to the polyester film after biaxially stretched or may be performed to the polyester film after uniaxially stretched. In this case, the polyester film may be further stretched after the coating in a direction different from the first stretching direction, and formed into a film. The polyester film may be stretched in two directions after the coating is performed to the polyester film before stretching.

The thickness of the undercoat layer is in the range of preferably 0.05 μm to 2 μm and more preferably about 0.1 μm to about 1.5 μm. When the film thickness is 0.05 μm or more, required adhesion is easily obtained. When the film thickness is 2 μm or lower, the surface condition can be favorably maintained.

—Fluororesin Layer and Silicon Resin Layer—

To the polyester film of the invention, at least one of a fluororesin layer and a silicon (Si) resin layer is preferably provided. By providing the fluororesin layer or the Si resin layer, dirt is prevented and the weather resistance of the surface of polyester is improved. Specifically, it is preferable to have a fluororesin coating layer described in JP-A Nos. 2007-35694 and 2008-28294 and WO2007/063698.

A fluororesin film, such as TEDLAR (trade name, manufactured by DuPont), is also preferably adhered thereto.

The thickness of the fluororesin layer and the Si resin layer each is in the range of preferably from 1 μm to 50 μm, more preferably from 1 μm to 40 μm, and still more preferable from 1 μm to 10 μm.

—Inorganic Layer—

An embodiment in which an inorganic layer is provided to the polyester film of the invention is also preferable. By providing the inorganic layer, a moisture resistance function or a gas barrier function for preventing entrance of water or gas into polyester can be imparted. The inorganic layer may be provided in any of the front surface or the back surface of the polyester film. From the viewpoint of waterproof, moistureproof, or the like, the inorganic layer is preferably provided to the surface of the polyester film opposite to the side (surface on which the colored layer or the adhesion layer is formed) facing the cell side substrate.

The moisture permeation amount (moisture permeability) of the inorganic layer is preferably $10^0$ g/m$^2$·d to $10^{-6}$ g/m$^2$·d, more preferably $10^1$ g/m$^2$·d to $10^{-5}$ g/m$^2$·d, and still more preferably $10^2$ g/m$^2$·d to $10^{-4}$ g/m$^2$·d.

In order to form the inorganic layer having such moisture permeability, the following dry method is preferable.

Examples of methods for forming a gas barrier inorganic layer (hereinafter also referred to as a gas barrier layer) by a dry method include vacuum evaporation methods, such as a resistance heating evaporation, an electron beam evaporation, an induction heating evaporation, and an assist method using plasma or ion beam, sputtering methods, such as a reactive sputtering method, an ion beam sputtering method, and an ECR (electron cyclotron) sputtering method, physical vapor deposition methods (PVD method), such as an ion plating method, and chemical vapor deposition methods (CVD method) utilizing heat, light, plasma, or the like. In particular, the vacuum evaporation method including forming a film by a vapor deposition method under vacuum is preferable.

Here, when materials forming the gas barrier layer contain inorganic oxides, inorganic nitrides, inorganic oxynitrides, inorganic halides, inorganic sulfides, and the like as the main component, a material having the same composition as the composition of the gas barrier layer to be formed can be directly volatilized and deposited on a base material or the like. However, when the formation is carried out by this method, the composition sometimes changes during the volatilization, and as a result the formed film sometimes does not exhibit uniform properties. Therefore, examples include (1) a method including volatilizing a material having the same composition as that of the barrier layer to be formed as the volatilization source while introducing oxygen gas in the case of inorganic oxides, nitrogen gas in the case of inorganic nitrides, a mixed gas of oxygen gas and nitrogen gas in the case of inorganic oxynitrides, halogen gas in the case of inorganic halides, or sulfur gas in the case of inorganic sulfides into a system in an auxiliary manner, (2) a method including introducing oxygen gas in the case of inorganic oxides, nitrogen gas in the case of inorganic nitrides, a mixed gas of oxygen gas and nitrogen gas in the case of inorganic oxynitrides, halogen gas in the case of inorganic halides, or sulfur gas in the case of inorganic sulfides into a system while volatilizing an inorganic substance as the volatilization source, and depositing them on the surface of a base material while reacting the inorganic substance and the introduced gas, (3) a method including volatilizing an inorganic substance as the volatilization source, forming a layer of the inorganic substance, and holding the layer in an oxygen gas atmosphere in the case of inorganic oxides, a nitrogen gas atmosphere in the case of inorganic nitrides, a mixed gas atmosphere of oxygen gas and nitrogen gas in the case of inorganic oxynitrides, a halogen gas atmosphere in the case of inorganic halides, or a sulfur gas atmosphere in the case of inorganic sulfides, and reacting the inorganic substance layer and the introduced gas.

Among the above, (2) or (3) is more preferably used in that volatilization from the volatilization source is easily performed. The method (2) is more preferably used in that the film quality is easily controlled. When the barrier layer is an inorganic oxide, a method including volatilizing an inorganic substance as the volatilization source to form a layer of the inorganic substance, and leaving the layer in the air to thereby naturally oxidize the inorganic substance is also preferable in that the formation is easily performed.

It is also preferable to adhere aluminum foil thereto to be used as a barrier layer. The thickness is preferably from 1 μm to 30 μm. When the thickness is 1 μm or more, water is difficult to permeate into the polyester film with time (thermal treatment) and hydrolysis is difficult to occur. When the thickness is 30 μm or lower, the thickness of the barrier layer does not become excessively large and no deformation is generated in the film due to the stress of the barrier layer.

(Solar Cell Module)

The solar cell module of the invention includes the polyester film (which may be a back sheet) of the invention previously described above, and preferably further include a transparent substrate at the sunlight entering side, a solar cell device that converts light energy of the sunlight into electrical energy, and a sealing material that seals the solar cell device.

For example, the solar cell module may be constituted, as illustrated in FIG. 1, by sealing a power generation device (solar cell device) 3 connected to metal wiring (not illustrated) that takes out electricity with a sealing material 2, such as an ethylene-vinyl acetate copolymer (EVA) resin, and sandwiching them between a transparent substrate 4, such as glass, and a back sheet 1 having the polyester film of the invention, and adhering them to each other, for example.

The transparent substrate may have light transmittance properties so that the sunlight transmits and can be selected as appropriate from base materials that transmit light. From the viewpoint of power generation efficiency, materials having a higher light transmittance are more preferable. As such substrates, a glass substrate, transparent resin, such as acrylic resin, and the like can be preferably used, for example.

As the solar cell device, known various solar cell devices, such as: a silicon type, such as single crystal silicon, polycrystalline silicon, and amorphous silicon, and III-V or II-VI compound semiconductors, such as copper-indium-gallium-selenium, copper-indium-selenium, cadmium-tellurium, and gallium-arsenide, can be applied.

According to an aspect of the invention, there are provided the following embodiments <1> to <15>.

<1> A polyester film comprising terminal carboxylic groups in an amount of from 2 eq/t to 23 eq/t, wherein an amount of carboxylic groups on a surface of the film is from 0.005 eq/m$^2$ to 0.2 eq/m$^2$, and a thickness of the film is from 120 µm to 500 µm.

<2> The polyester film according to <1>, wherein an amount of hydroxyl groups on the surface of the film is from 0.05 eq/m$^2$ to 0.3 eq/m$^2$.

<3> The polyester film according to <1> or <2>, wherein an intrinsic viscosity (IV) of the film is from 0.60 to 0.90.

<4> The polyester film according to any one of <1> to <3>, wherein the thickness of the film is from 200 µm to 400 µm.

<5> The polyester film according to any one of <1> to <4>, further comprising titanium atoms in an amount of from 1 ppm to 30 ppm.

<6> The polyester film according to any one of <1> to <5>, having at least one white layer having a thickness of from 1 µm to 10 µm.

<7> The polyester film according to <6>, further having, on the white layer, at least one adhesion layer exhibiting adhesion to an adherend containing an ethylene-vinyl acetate copolymer.

<8> The polyester film according to any one of <1> to <7>, having at least one inorganic layer having a moisture permeability of from 10$^{-6}$ g/m$^2$·d to 1 g/m$^2$·d.

<9> The polyester film according to <8>, wherein the inorganic layer is a vapor deposition film formed by vacuum deposition.

<10> The polyester film according to any one of <1> to <9>, having at least one layer selected from the group consisting of a fluororesin layer having a thickness of from 1 µm to 10 µm and a silicon resin layer having a thickness of from 1 µm to 10 µm.

<11> The polyester film according to any one of <6>, <7> and <10>, wherein the white layer is formed by coating.

<12> A solar cell module comprising the polyester film according to any one of <1> to <11>.

<13> A method for manufacturing a polyester film, comprising:
solid-phase polymerizing a polyester; and
melting and kneading the solid-phase polymerized polyester and then extruding the polyester from a die, thereby forming a polyester film containing terminal carboxylic groups in an amount of from 2 eq/t to 23 eq/t, wherein an amount of carboxylic groups on a surface of the film is from 0.005 eq/m$^2$ to 0.2 eq/m$^2$, and a thickness of the film is from 120 µm to 500 µm.

<14> The method for manufacturing a polyester film according to <13>, further comprising, before the solid phase polymerization, synthesizing the polyester by carrying out an esterification reaction of a dicarboxylic acid or an ester derivative thereof and a diol compound in the presence of a titanium catalyst.

<15> The method for manufacturing a polyester film according to <14>, wherein the synthesis of the polyester is performed in the presence of the titanium catalyst in an amount that corresponds to an amount of titanium atoms of from 1 ppm to 30 ppm.

The invention can provide a polyester film that has excellent hydrolysis resistance, has resistance to deterioration with time, and can maintain adhesion to an adherend over a long period of time when applied to long-term use, such as a solar cell use.

The invention can also provide a solar cell module that can obtain stable power generation performance over a long period of time.

The invention can provide a method for manufacturing a polyester film capable of producing a polyester film having excellent hydrolysis resistance by controlling the amount of COOH groups and hydroxyl groups on the film surface.

EXAMPLES

Hereinafter, the invention will be more specifically described with reference to Examples but is not limited to the following Examples. Unless otherwise specified, "part" is based on the mass.

Example 1

—1. Synthesis of Polyester Resin—
(1) PET-1: Ti Catalyst PET

By performing polymerization while changing the amount of a Ti catalyst (titanium alkoxide compound) to be added according to the method described below, four kinds of PET samples (PET-1) in which the Ti amounts were 5 ppm, 10 ppm, 14 ppm, and 32 ppm were obtained as shown in Table 1 below. A specific method is as follows.

17.3 kg of terephthalic acid and 8.4 kg of ethylene glycol were supplied to an esterification reaction vessel. To the vessel, a 2% by mass ethylene glycol solution of a titanium alkoxide compound was added so that the addition amount of titanium element was 10 ppm based on the polymer to be obtained. An ethylene glycol solution of magnesium acetate was added so that the addition amount of magnesium element was 80 ppm based on the polymer to be obtained. Then, the esterification reaction vessel was adjusted so that the temperature was 250° C. and the pressure was 3.0×10$^5$ [Pa]. Then, it was confirmed that water was distilled by the esterification reaction, and then the reaction was performed for 3 hours. Thereinafter, the obtained esterification reaction product was transferred to a polymerization reaction vessel.

Subsequently, to a condensation polymerization reaction vessel to which the esterification reaction product was transferred, a 25% by mass ethylene glycol solution of trimethyl phosphate was added so that the addition amount of phosphorus element was 65 ppm based on the polymer to be obtained. Thereafter, the temperature of the reaction system was gradually increased from 250° C. to 280° C. and the pressure was reduced to 20 Pa. Both the time until the temperature reached the final temperature and the time until the pressure reached the final pressure were 60 minutes. When reaching a given stirring torque, the reaction system was purged with nitrogen, the pressure was returned to a normal pressure, and the condensation polymerization reaction was stopped.

Thereafter, the polymer was discharged in cold water in the shape of a strand, and immediately cut to prepare pellets (Major axis of 3 mm, Length of 4 mm) of the polymer. The time from starting decompression to reaching the given stirring torque was 2.5 hours.

For the titanium alkoxide used as a catalyst, Tyzor-PC43 (trade name) manufactured by DuPont was used.

(2) PET-2: Ti Catalyst PET

By performing polymerization while changing the amount of a Ti catalyst (tetra-n-butyl titanate) to be added according to the method shown below, five kinds of PET samples (PET-2) in which the Ti amount varied in the range of 5 ppm to 12 ppm were obtained as shown in Table 1 below. A specific method is as follows.

A mixture of 100 parts of dimethyl terephthalate and 70 parts of ethylene glycol and 0.009 part of tetra-n-butyl titanate were placed in an SUS container in which a pressurization reaction can be performed, a pressure of 0.07 MPa was applied, and an ester exchange reaction was carried out while increasing the temperature to 140° C. to 240° C. Thereafter, 0.04 part of triethyl phosphonoacetate was added to terminate the ester exchange reaction. Furthermore, 0.2% by mass of colloidal silica particles having an average particle diameter of 0.3 μm was added as lubricant particles. Thereafter, the reaction product was transferred to a polymerization container, the temperature was increased to 290° C., and a condensation polymerization reaction was performed in a high vacuum of 0.2 mmHg or lower, thereby obtaining polyethylene terephthalate in which the intrinsic viscosity was 0.60 and the amount of diethylene glycol was 1.5%.

(3) PET-3: Sb, Ti Catalyst

By performing polymerization while changing the amount of a Ti catalyst (titanium alkoxide compound) to be added according to the method described below, seven kinds of PET samples in which 25 ppm antimony (Sb) was contained and the titanium (Ti) amount varied in the range of 0 ppm to 33 ppm were obtained as shown in Table 1 below. A specific method is as follows.

100 parts of dimethyl terephthalate and 70 parts of ethylene glycol were subjected to an ester exchange reaction in accordance with a standard manner using calcium acetate monohydrate and magnesium acetate tetrahydrate as an ester exchange catalyst, and then trimethyl phosphate was added to substantially terminate the ester exchange reaction. Furthermore, titanium tetrabutoxide and antimony trioxide were added. Thereafter, condensation polymerization was performed under a high temperature and a high vacuum in accordance with a standard manner, thereby obtaining polyethylene terephthalate having an intrinsic viscosity (o-chlorophenol, 35° C.) of 0.60.

(4) PET-4: Ti Catalyst

A PET sample was obtained in accordance with the method shown below.

—Esterification Reaction—

4.7 tons of high purity terephthalic acid and 1.8 tons of ethylene glycol were mixed over 90 minutes to form a slurry. Then, the slurry was continuously supplied at a flow rate of 3800 kg/h to a first esterification reaction vessel. An ethylene glycol solution of a citric acid chelated titanium complex (VERTEC AC-420, trade name, manufactured by Johnson Matthey) in which citric acid was coordinated to a Ti metal was continuously supplied, and the reaction was performed at a reaction vessel internal temperature of 250° C. and an average retention time under stirring of about 4.3 hours. In the process, the citric acid chelated titanium complex was continuously added so that the Ti element addition amount was 9 ppm. In this case, the acid value of the obtained oligomer was 600 eq/ton.

The reactant was transferred to a second esterification reaction vessel, and reacted under stirring at a reaction vessel internal temperature of 250° C. and an average retention time of 1.2 hours, thereby obtaining an oligomer having an acid value of 200 eq/ton. The inside of the second esterification reaction vessel was divided into three zones. At the second zone among the three zones, an ethylene glycol solution of magnesium acetate was continuously supplied so that the addition amount of Mg element was 75 ppm. At the third zone, an ethylene glycol solution of trimethyl phosphate was continuously supplied so that the addition amount of P element was 65 ppm.

—Condensation Polymerization Reaction—

The obtained esterification reaction product was continuously supplied to a first condensation polymerization reaction vessel, and condensation polymerization was performed under stirring under the conditions of a reaction temperature of 270° C., a reaction vessel internal pressure of 20 torr ($2.67 \times 10^{-3}$ MPa), and an average retention time of about 1.8 hours. The resultant was further transferred to a second condensation polymerization reaction vessel, and was reacted (condensation polymerization) under stirring in the reaction vessel under the conditions of a reaction vessel internal temperature of 276° C., a reaction vessel internal pressure of 5 ton ($6.67 \times 10^{-4}$ MPa), and a retention time of about 1.2 hours. Subsequently, the resultant was further transferred to a third condensation polymerization reaction vessel, and was reacted (condensation polymerization) in the reaction vessel under the conditions of a reaction vessel internal temperature of 278° C., a reaction vessel internal pressure of 1.5 torr ($2.0 \times 10^{-4}$ MPa), and a retention time of 1.5 hours, thereby obtaining polyethylene terephthalate.

(5) PEN: Sb Catalyst

A PEN sample was obtained using an Sb catalyst by performing polymerization in accordance with the conditions described in "Comparative Example 6" in Table 3 of Japanese Patent No. 3119067.

—2. Solid Phase Polymerization—

The PET sample and the PEN sample that were polymerized above were formed into pellets (Diameter of 3 mm, Length of 7 mm), and a solid phase polymerization was carried out using the obtained resin pellets by the following batch method and continuous method.

(i) Batch Method

The resin pellets were charged in a container, and a solid phase polymerization was carried out under the conditions of Table 1 below while evacuating and stirring.

(ii) Continuous Method

The resin pellets were supplied into a silo of Length/Diameter=20. Then, the speed of a sending device provided at the outlet was adjusted so that the resin stayed until the time shown in Table 1 below passed. In the process, the circumference of the silo was heated and a heated $N_2$ gas was made to flow in such a manner as to achieve the temperature shown in Table 1 below.

—3. Extrusion Molding—

The PET sample and the PEN sample in which the solid phase polymerization was completed as described above were dried so that the moisture content was 20 ppm or lower, put in a hopper of a uniaxial kneading extruder having a diameter of 50 mm, melted at 270° C., and then extruded. The molten object (melt) was made to pass through a gear pump and a filter (pore size of 20 μm), and then extruded to a cooling (chill) roll from a die under the following conditions. The extruded melt was brought into close contact with the cooling roll using an electrostatic charging method.

<Conditions>

(a) Shear Rate when Extruding Melt from Die

The melt extrusion rate and the width and the height of a die slit were adjusted. Thus, the shear rates shown in Table 1 below were achieved. The shear rate ($sec^{-1}$) is calculated by Formula below from the discharge amount Q (g/sec) of the extruder, the width W (cm) and the height H (cm) of the slit portion of the die.

$$\text{Shear rate}(sec^{-1}) = \{(Q/1.1)/(W \times H)\}/H$$

(b) Fluctuation of Extrusion Amount

The fluctuations shown in Table 1 below were given to a screw drive motor of the extruder. Thus, the die line produced by die swelling was suppressed. The fluctuation refers to a value, which is obtained by measuring the discharge amount for 1 minute, and dividing a difference between the maximum value and the minimum value by the average value, and which is expressed in percentage.

(c) Humidity from Die to Cooling Roll

A transfer region (air gap) from a die outlet to the cooling roll was enclosed, and a humidity-controlled air was introduced thereinto. Thus, the humidity was adjusted as shown in Table 1 below.

(d) Thickness of Melt Extruded from Die

The discharge amount of the extruder and the slit height of the die were adjusted. Thus, the melt thickness was adjusted as shown in Table 1 below. The melt thickness was measured by taking a photograph of the melt by a camera disposed at the die outlet.

(e) Temperature Unevenness in Cooling Roll

A hollow chill roll was used, and a heating medium (e.g., water) is made to pass through it to adjust the temperature. In the process, a baffle plate is disposed in the chill roll to produce temperature unevenness. With respect to the temperature unevenness, the baffle plate is adjusted while measuring the surface temperature of the chill roll by a non-contact thermometer (thermoviewer).

—4. Stretching—

To unstretched films that were extruded onto the cooling roll by the method described above and solidified, biaxially stretching was successively performed by the following method, thereby obtaining films having the thickness shown in Table 2 below.

<Stretching Method>

(a) Lengthwise Stretching

The unstretched film was made to pass through two pairs of nip rolls having different circumferential speeds, and stretched in the lengthwise direction (conveyance direction). The stretching was performed at a preheating temperature of 95° C., a stretching temperature of 95° C., a stretching ratio of 3.5 times, and a stretching speed of 3000%/second.

(b) Crosswise Stretching

The film subjected to the lengthwise stretching was subjected to crosswise stretching using a tenter under the following conditions.

<Conditions>
Preheating temperature: 110° C.
Stretching temperature: 120° C.
Stretching ratio: 3.9 times
Stretching speed: 70%/second —5. Heat Fixation and Heat Relaxation—

Subsequently, the stretched film after subjected to the lengthwise stretching and the crosswise stretching was heat fixed under the following conditions. After heat fixing, heat relaxation was performed by reducing the tenter width under the following conditions.

<Heat Fixing Conditions>
Heat Fixing Temperature: 215° C.
Heat Fixing Time: 2 seconds
<Heat Relaxation Conditions>
Heat relaxation temperature: 210° C.
Heat relaxation ratio: 2%

—6. Winding—

After subjected to heat fixation and heat relaxation, both ends of the film were trimmed by 10 cm. Thereafter, the both ends of the film were subjected to press processing (knurling) at a width of 10 mm, and then wound at a tension of 25 kg/m. The width was 1.5 m and the winding length was 2000 m.

As described above, PET films and PEN films of the invention and PET films and PEN films for comparison (hereinafter also generally referred to as "sample films") were produced.

—7. Evaluation of Film—

The sample films produced as described above were measured for the physical properties (thickness, surface OH amount, surface COOH amount, IV, terminal COOH amount, deformation, die line). Each measurement result is shown in Table 2 below.

The measurement and evaluation of each of the physical properties were performed by the following methods.

(Surface Oh Amount)

The OH groups on the film surface were labeled with a fluorine reagent, and then measured using XPS (Chemical Modification XPS) by the following procedure.

<Procedure>

[1] The sample film is cut into a 3 cm square, the cut sample film and 0.2 ml of a labeling reagent ($CF_3CO)_2O$ are put in a sealed container (here, using a weighing bottle), and allowed to stand for 10 minutes at room temperature.

[2] For the sample film after allowed to stand, the area (Sf) of the F1s signal and the area (Sc) of the C1s signal are determined using an XPS device [Axis-HSi (trade name), manufactured by Shimadzu Corp.].

[3] The surface OH amount (Molar ratio of OH to the total carbon amount) is determined from the following Formula.

$$\text{Surface OH amount } [eq/m^2] = \{(Sf/F1s \text{ ionization cross section})/3\}/\{Sc/C1s \text{ ionization cross section}\}$$

[4] The surface OH amount is measured for both surfaces of the sample film, and the average value [$eq/m^2$] is calculated.

(COOH Amount)

The COOH groups on the film surface were labeled with a fluorine reagent, and then measured using XPS (Chemical Modification XPS) by the following procedure.

<Procedure>

[1] The sample film is cut into a 3 cm square, the cut sample film and 0.2 ml of a labeling reagent $CF_3CH_2NHNH_2$ (70% by mass aqueous solution) are put in a sealed container (here, using a weighing bottle), and allowed to stand for 2 hours at room temperature.

[2] For the sample film, the area (Sf) of the F1s signal and the area (Sc) of the C1s signal are determined using an XPS device [Axis-HSi (trade name), manufactured by Shimadzu Corp.].

[3] The surface COOH amount (Molar ratio of COOH to the total carbon amount) is determined from the following Formula.

$$\text{Surface COOH amount } [eq/m^2] = \{(Sf/F1s \text{ ionization cross section})/3\}/\{Sc/C1s \text{ ionization cross section}\}$$

(F1s Ionization Cross Section=3.60, C1s Ionization Cross Section=1)

[4] The surface COOH amount is measured for both surfaces of the sample film, and the average value $[eq/m^2]$ is calculated.

(Terminal Carboxylic Group Amount)

Polyester which was the sample film was completely dissolved in a mixed solution of benzyl alcohol/chloroform (=2/3; volume ratio), the solution was titrated using phenol red as an indicator with a standard liquid (0.025N KOH-methanol mixed solution), and the terminal carboxylic group amount [eq/t] was calculated from the titer.

(IV Value)

The IV was determined from the solution viscosity at 30° C. in a mixed solvent of 1,1,2,2-tetrachloroethane/phenol (=2/3 [mass ratio]).

(Ti Amount, Sb Amount)

The Ti amount and the Sb amount were measured by an X-ray fluorescence method using a X-ray fluorescence element analyzer [MESA-500 W (trade name), manufactured by Horiba, Ltd.]. Calibration curves were prepared for sample films to which titanium oxide was added in an amount of Ti element of 0 ppm to 100 ppm and sample films to which antimony trioxide was added in an amount of Sb element of 0 ppm to 100 ppm, and then the amount of Ti element and Sb element contained in the sample was determined therefrom.

(Deformation)

A 1 m long portion with full width was sampled from the sample film. The sampled one was placed on a flat bed, and the number of portions rising from the surface of the flat bed was counted, and the number was divided by the area of the sample film to be defined as the number of deformations per $1\ m^2$.

(Die Line)

A 1 m long portion with full width was sampled from the sample film. The sampled one was projected from the light source disposed 3 m apart from the sample film to a screen disposed 50 cm apart therefrom in parallel thereto, the number of 0.1 mm to 5 mm lines having different densities was counted, the number of the lines was divided by the full width to thereby determine the number of the lines per 1 m.

—8. Production of Back Sheet—

To one surface of each sample film obtained as described above, the following (i) reflective layer and (ii) adhesion layer were formed by coating in this order.

(i) Reflective Layer (Colored Layer)

First, the components of the following composition were mixed, and dispersed for 1 hour by a DYNO mill dispersing machine, thereby preparing a pigment dispersion.

<Formulation of Pigment Dispersion>

Titanium dioxide . . . 39.9 parts
(TIPAQUE R-780-2 (trade name), manufactured by Ishihara Sangyo Kaisha, Ltd., solid content of 100%)

Polyvinyl alcohol . . . 8.0 parts
(PVA-105 (trade name), manufactured by Kuraray, solid content of 10%)

Surfactant (DEMOL EP (trade name), manufactured by Kao Corp., solid content of 25%) . . . 0.5 part Distilled water . . . 51.6 parts Subsequently, a coating liquid for forming a reflective layer was prepared by mixing the components of the following composition using the obtained pigment dispersion.

<Composition of Coating Liquid for Forming Reflective Layer>

Pigment dispersion above . . . 71.4 parts

Polyacrylic resin water dispersion . . . 17.1 parts
(Binder: JURYMER ET-410 (trade name), manufactured by Nihon Junyaku Co., Ltd.), solid content: 30% by mass)

Polyoxyalkylene alkyl ether . . . 2.7 parts
(NALOACTY-CL95 (trade name), manufactured by Sanyo Chemical Industries, Ltd., solid content: 1% by mass)

Oxazoline compound (crosslinking agent) . . . 1.8 parts
(EPOCROS WS-700 (trade name), manufactured by NIPPON SHOKUBAI CO., LTD., solid content: 25% by mass)

Distilled water . . . 7.0 parts

The coating liquid for forming a reflective layer obtained above was applied to the sample film by a bar coater, and dried at 180° C. for 1 minute, thereby forming a reflective layer (white layer) in which the titanium dioxide coating amount was 6.5 $g/m^2$.

(ii) Adhesion Layer

An adhesion layer coating liquid was prepared by mixing the components of the following composition. The coating liquid was applied onto the reflective layer so that the binder coating amount was 0.09 $g/m^2$. Thereafter, the coating liquid was dried at 180° C. for 1 minute to form an adhesion layer.

<Composition of Adhesion Layer Coating Liquid>

Polyolefin resin water dispersion . . . 5.2 parts
(Binder: CHEMIPEARL S75N (trade name, manufactured by Mitsui Chemicals, Inc., solid content: 24%)

Polyoxyalkylene alkyl ether . . . 7.8 parts
(NALOACTY-CL95 (trade name), manufactured by Sanyo Chemical Industries, Ltd., solid content: 1% by mass)

Oxazoline compound . . . 0.8 part
(EPOCROS WS-700 (trade name), manufactured by NIPPON SHOKUBAI CO., LTD., solid content 25% by mass)

Silica particle water dispersion . . . 2.9 parts
(AEROSIL OX-50 (trade name), manufactured by Japan Aerosil Co., solid content: 10% by mass)

Distilled water . . . 83.3 parts

Next, the following (iii) undercoat layer, (iv) barrier layer, and (v) antifouling layer were successively formed by coating from the sample film side on the surface opposite to the side, on which the reflective layer and the adhesion layer were formed, of the sample film.

(iii) Undercoat Layer

An undercoat layer coating liquid was prepared by mixing the components of the following composition. The coating liquid was applied to the sample film, and dried at 180° C. for 1 minute to form an undercoat layer (dry coating amount: about 0.1 $g/m^2$).

<Composition of Undercoat Layer Coating Liquid>

Polyester resin . . . 1.7 parts
(VYLONAL MD-1200 (trade name), manufactured by Toyobo Co., Ltd., solid content: 17% by mass)

Polyester resin . . . 3.8 parts
(PESRESIN A-520 (trade name), manufactured by Takamatsu Oil & Fat Co. Ltd., solid content: 30% by mass)

Polyoxyalkylene alkyl ether . . . 1.5 parts
(NALOACTY-CL95 (trade name), manufactured by Sanyo Chemical Industries, Ltd., solid content: 1% by mass)

Carbodiimide compound . . . 1.3 parts (CARBODILITE V-02-L2 (trade name), manufactured by Nisshinbo Industries, Inc., solid content: 10% by mass)

Distilled water . . . 91.7 parts (iv) Barrier Layer

Subsequently, a 800 Å thick vapor deposition film of silicon oxide was formed on the surface of the formed undercoat layer under the following vapor deposition conditions to be used as a barrier layer.

<Vapor Deposition Conditions>

Reactive gas mixing ratio (unit:slm): Hexamethyldisiloxane/Oxygen gas/Helium=1/10/10

Vacuum degree in a vacuum chamber: $5.0 \times 10^{-6}$ mbar

Vacuum degree in a vapor deposition chamber: $6.0 \times 10^{-2}$ mbar

Cooling and electrode drum supply power: 20 kW

Film conveyance speed: 80 m/minute (v) Antifouling Layer

As shown below, coating liquids for forming a first antifouling layer and a second antifouling layer were prepared, the first antifouling layer coating liquid and the second antifouling layer coating liquid were applied onto the barrier layer in this order, and a two-layer antifouling layer was formed by coating.

<First Antifouling Layer>

—Preparation of First Antifouling Layer Coating Liquid—

A first antifouling layer coating liquid was prepared by mixing the components of the following composition.

<Composition of Coating Liquid>

CERANATE WSA1070 (trade name, manufactured by DIC Corporation) . . . 45.9 parts

Oxazoline compound (crosslinking agent) . . . 7.7 parts by mass (EPOCROS WS-700 (trade name), manufactured by NIPPON SHOKUBAI CO., LTD., solid content: 25% by mass)

Polyoxyalkylene alkyl ether . . . 2.0 parts (NALOACTY-CL95 (trade name), manufactured by Sanyo Chemical Industries, Ltd., solid content: 1% by mass)

Pigment dispersion used in the reflective layer . . . 33.0 parts

Distilled water . . . 11.4 parts

—Formation of First Antifouling Layer—

The obtained coating liquid was applied onto the barrier layer so that the binder coating amount was 3.0 g/m², and was dried at 180° C. for 1 minute, thereby forming the first antifouling layer.

—Preparation of Second Antifouling Layer Coating Liquid—

A second antifouling layer coating liquid was prepared by mixing the components of the following composition.

<Composition of Coating Liquid>

Fluorine binder: OBBLIGATO (trade name, manufactured by AGC COAT-TECH CO., LTD.) . . . 45.9 parts Oxazoline compound . . . 7.7 parts (EPOCROS WS-700 (trade name), manufactured by NIPPON SHOKUBAI CO., LTD., solid content: 25% by mass; crosslinking agent)

Polyoxyalkylene alkyl ether . . . 2.0 parts (NALOACTY-CL95 (trade name), manufactured by Sanyo Chemical Industries, Ltd., solid content: 1% by mass)

Pigment dispersion above prepared for the reflective layer . . . 33.0 part

Distilled water . . . 11.4 parts

—Formation of Second Antifouling Layer—

The prepared second antifouling layer coating liquid was applied onto the first antifouling layer formed on the barrier layer so that the binder coating amount was 2.0 g/m², and was dried at 180° C. for 1 minute to form the second antifouling layer.

As described above, a back sheet having the reflective layer and the adhesion layer at one side of the polyester film and having the undercoat layer, the barrier layer, and the antifouling layer at the other side was produced.

—9. Evaluation of Back Sheet—

The back sheet provided with the respective (i) to (v) layers was subjected to thermal treatment (at 120° C. and 100% RH for 100 hours), and then was evaluated by the following method. The evaluation results are shown in Table 2 below. The thermal treatment conditions are very severe conditions compared with the conditions of 85° C. and 85% RH.

(Adhesion)

In order to estimate adhesion under severer conditions, 10 cuts were formed at intervals of 5 mm to form a grid in the surface (front surface) at the side, on which the white layer and the adhesion layer were formed by coating, of the sample film constituting the back sheet and the surface (back surface) on the back side (side, on which the undercoat layer, the barrier layer, and the antifouling layer were formed by coating, of the sample film), a pressure sensitive adhesion tape (polyester pressure sensitive adhesion tape manufactured by NITTO DENKO CORP. (No. 31B)) was adhered on each surface, the tapes were sufficiently rubbed in order that the adhesive entered the grid-like cuts, and then the sample was allowed to stand for 2 hours. Thereafter, the tapes were peeled quickly, and then the number of the peeled squares of the grid was counted. Then, the adhesion degree was calculated by Formula below to be used as the index for evaluating the adhesion.

Adhesion (%)=(Number of peeled portions)/(Number of all the squares of the grid)×100

Table 2 below shows the average value of the adhesion of the front surface and the adhesion of the back surface. A practically permissible range of adhesion is 20% or lower.

(Hydrolysis Resistance)

The hydrolysis resistance was evaluated from a measured value obtained by measuring the breaking elongation of the back sheet before and after the thermal treatment by the following method.

The back sheet was cut to prepare five sample films with the size of 1 cm width×20 cm in each of MD and TD. The samples were stretched at a distance between chucks of 20 mm at 20% per minute, and then the breaking elongation was determined. Then, the average value of the breaking elongation of the 10 samples in MD and TD was determined, and the degree of hydrolysis resistance was calculated by the following Formula to be used as the index for evaluating the hydrolysis resistance.

Hydrolysis resistance (%)=Breaking elongation after thermal treatment/Breaking elongation before thermal treatment×100

A practically permissible hydrolysis resistance range is 50% or more.

—10. Production of Solar Cell Module—

Each of the back sheets produced as described above was adhered to a transparent filler so that the structure shown in FIG. 1 of JP-A No. 2009-158952 was obtained, thereby producing a solar cell module. In the process, the back sheet was adhered so that the adhesion layer of the back sheet was in contact with the transparent filler embedding a solar cell device.

TABLE 1

| | | Catalyst | | Solid phase polymerization | | | Extrusion | | | | | | |
| | | | | | | | Knead-ing | | Fluc-tuation of extru- | | Chill roll tem-perature | | |
| | | | | | | | | Shear | sion | Melt | une- | Air gap | |
| Film type | Resin | Ti (ppm) | Sb (ppm) | Temp (° C.) | Time (hr) | Method | temp (° C.) | rate (sec$^{-1}$) | amount (%) | thickness (mm) | venness (° C.) | humidity (% rh) | Remarks |
|---|---|---|---|---|---|---|---|---|---|---|---|---|---|
| B-1 | PET-1 | 10 | — | 210 | 22 | Batch | 280 | 100 | 1.2 | 3.5 | 1.5 | 4 | Comp. Ex. |
| A-1 | PET-1 | 10 | — | 210 | 22 | Batch | 280 | 100 | 1.2 | 3.5 | 1.5 | 5 | Present invention |
| A-2 | PET-1 | 10 | — | 210 | 22 | Batch | 280 | 100 | 1.2 | 3.5 | 1.5 | 10 | Present invention |
| A-3 | PET-1 | 10 | — | 210 | 22 | Batch | 280 | 100 | 1.2 | 3.5 | 1.5 | 20 | Present invention |
| A-4 | PET-1 | 10 | — | 210 | 22 | Batch | 280 | 100 | 1.2 | 3.5 | 1.5 | 55 | Present invention |
| A-5 | PET-1 | 10 | — | 210 | 22 | Batch | 280 | 100 | 1.2 | 3.5 | 1.5 | 60 | Present invention |
| B-2 | PET-1 | 10 | — | 210 | 22 | Batch | 280 | 100 | 1.2 | 3.5 | 1.5 | 65 | Comp. Ex. |
| B-3 | PET-2 | 5 | — | 200 | 110 | Continuous | 310 | 150 | 0.8 | 3 | 1 | 30 | Comp. Ex. |
| A-6 | PET-2 | 6 | — | 200 | 100 | Continuous | 300 | 150 | 0.8 | 3 | 1 | 30 | Present invention |
| A-7 | PET-2 | 8 | — | 200 | 75 | Continuous | 260 | 150 | 0.8 | 3 | 1 | 30 | Present invention |
| A-8 | PET-2 | 8 | — | 200 | 25 | Continuous | 275 | 150 | 0.8 | 3 | 1 | 30 | Present invention |
| A-9 | PET-2 | 8 | — | 200 | 10 | Continuous | 290 | 150 | 0.8 | 3 | 1 | 30 | Present invention |
| A-10 | PET-2 | 10 | — | 200 | 5 | Continuous | 250 | 150 | 0.8 | 3 | 1 | 30 | Present invention |
| B-4 | PET-2 | 12 | — | 200 | 4 | Continuous | 240 | 150 | 0.8 | 3 | 1 | 30 | Comp. Ex. |
| B-5 | PET-1 | 5 | — | 220 | 15 | Batch | 270 | 50 | 2 | 1.5 | 2 | 40 | Comp. Ex. |
| A-11 | PET-1 | 5 | — | 220 | 15 | Batch | 270 | 50 | 2 | 2 | 2 | 40 | Present invention |
| A-12 | PET-1 | 5 | — | 220 | 15 | Batch | 270 | 50 | 2 | 2.5 | 2 | 40 | Present invention |
| A-13 | PET-1 | 5 | — | 220 | 15 | Batch | 270 | 50 | 2 | 4 | 2 | 40 | Present invention |
| A-14 | PET-1 | 5 | — | 220 | 15 | Batch | 270 | 50 | 2 | 7 | 2 | 40 | Present invention |
| A-15 | PET-1 | 5 | — | 220 | 15 | Batch | 270 | 50 | 2 | 8 | 2 | 40 | Present invention |
| B-6 | PET-1 | 5 | — | 220 | 15 | Batch | 270 | 50 | 2 | 9 | 2 | 40 | Comp. Ex. |
| A-16 | PET-1 | 10 | — | 220 | 15 | Batch | 270 | 50 | 2 | 3 | 0.1 | 40 | Present invention |
| A-17 | PET-1 | 10 | — | 220 | 15 | Batch | 270 | 50 | 2 | 3 | 0.3 | 40 | Present invention |
| A-18 | PET-1 | 10 | — | 220 | 15 | Batch | 270 | 50 | 2 | 3 | 1 | 40 | Present invention |
| A-19 | PET-1 | 10 | — | 220 | 15 | Batch | 270 | 50 | 2 | 3 | 4 | 40 | Present invention |
| A-20 | PET-1 | 10 | — | 220 | 15 | Batch | 270 | 50 | 2 | 3 | 5 | 40 | Present invention |
| A-21 | PET-2 | 12 | — | 190 | 35 | Continuous | 285 | 0.7 | 2.5 | 4.2 | 0.7 | 50 | Present invention |
| A-22 | PET-2 | 12 | — | 190 | 35 | Continuous | 285 | 1 | 2.5 | 4.2 | 0.7 | 43 | Present invention |
| A-23 | PET-2 | 12 | — | 190 | 35 | Continuous | 285 | 10 | 2.5 | 4.2 | 0.7 | 37 | Present invention |
| A-24 | PET-2 | 12 | — | 190 | 35 | Continuous | 285 | 80 | 2.5 | 4.2 | 0.7 | 31 | Present invention |
| A-25 | PET-2 | 12 | — | 190 | 35 | Continuous | 285 | 200 | 2.5 | 4.2 | 0.7 | 24 | Present invention |
| A-26 | PET-2 | 12 | — | 190 | 35 | Continuous | 285 | 300 | 2.5 | 4.2 | 0.7 | 17 | Present invention |
| A-27 | PET-2 | 12 | — | 190 | 35 | Continuous | 285 | 330 | 2.5 | 4.2 | 0.7 | 10 | Present invention |
| A-28 | PET-2 | 12 | — | 190 | 35 | Continuous | 285 | 150 | 0.1 | 4.2 | 0.7 | 28 | Present invention |
| A-29 | PET-2 | 12 | — | 190 | 35 | Continuous | 285 | 150 | 0.2 | 4.2 | 0.7 | 28 | Present invention |
| A-30 | PET-2 | 12 | — | 190 | 35 | Continuous | 285 | 150 | 1.5 | 4.2 | 0.7 | 28 | Present invention |
| A-31 | PET-2 | 12 | — | 190 | 35 | Continuous | 285 | 150 | 4 | 4.2 | 0.7 | 28 | Present invention |
| A-32 | PET-2 | 12 | — | 190 | 35 | Continuous | 285 | 150 | 5 | 4.2 | 0.7 | 28 | Present invention |
| A-33 | PET-3 | 0 | 25 | 200 | 18 | Batch | 275 | 80 | 0.8 | 6 | 1.5 | 20 | Present invention |
| A-34 | PET-3 | 1 | 25 | 200 | 18 | Batch | 275 | 80 | 0.8 | 6 | 1.5 | 20 | Present invention |
| A-35 | PET-3 | 2 | 25 | 200 | 18 | Batch | 275 | 80 | 0.8 | 6 | 1.5 | 20 | Present invention |
| A-36 | PET-3 | 7 | 25 | 200 | 18 | Batch | 275 | 80 | 0.8 | 6 | 1.5 | 20 | Present invention |
| A-37 | PET-3 | 20 | 25 | 200 | 18 | Batch | 275 | 80 | 0.8 | 6 | 1.5 | 20 | Present invention |
| A-38 | PET-3 | 30 | 25 | 200 | 18 | Batch | 275 | 80 | 0.8 | 6 | 1.5 | 20 | Present invention |
| A-39 | PET-3 | 33 | 25 | 200 | 18 | Batch | 275 | 80 | 0.8 | 6 | 1.5 | 20 | Present invention |
| A-40 | PET-1 | 32 | — | 210 | 0 | Batch | 280 | 0.5 | 1 | 380 | 1 | 55 | Present invention |
| A-41 | PET-1 | 32 | — | 210 | 0 | Batch | 280 | 30 | 1 | 380 | 1 | 20 | Present invention |
| A-42 | PET-1 | 32 | — | 210 | 18 | Batch | 280 | 30 | 1 | 380 | 1 | 20 | Present invention |
| A-43 | PET-1 | 14 | — | 210 | 18 | Batch | 280 | 30 | 1 | 380 | 1 | 20 | Present invention |
| A-44 | PEN | | Sb | 220 | 21 | Continuous | 290 | 110 | 1.2 | 370 | 0.8 | 25 | Present invention |
| B-7 | PET* | — | 10 | Not performed | | | 280 | 0.2 | 0 | 0.4 | 0 | 60 | Comp. Ex. * |
| A-45 | PET-1 | 10 | — | 205 | 18 | Continuous | 280 | 50 | 1 | 3.6 | 1 | 25 | Present invention |
| B-8 | LUMIRROR TYPE E20 (trade name, manufactured by Toray Industries. Inc., Thickness of 50 μm) | | | | | | | | | | | | | Comp. Ex. ** |
| A-46 | PET-1 | 10 | — | 205 | 18 | Continuous | 280 | 50 | 1 | 3.6 | 1 | 25 | Present invention |
| B-9 | PET-1 | 10 | — | Not performed | | | 280 | 0.1 | 0 | 1.5 | 0 | 65 | Comp. Ex. |
| A-47 | PET-1 | 10 | — | 205 | 18 | Continuous | 280 | 50 | 1 | 3.6 | 1 | 25 | Present invention |
| A-48 | PET-4 | 10 | — | 210 | 22 | Batch | 280 | 100 | 1.2 | 3.5 | 1.5 | 20 | Present invention |

Comp. Ex. * (PET*): According to Example 1 of Patent Document 1 (JP-A No. 2007-268710)
Comp. Ex. **: According to Patent Document 2 (JP-A No. 2003-60218)

TABLE 2

| Film | Resin | Thickness (μm) | Surface OH amount (eq/m$^2$) | Surface COOH amount (eq/m$^2$) | Terminal carboxylic group amount (eq/t) | IV | Deformations (/m$^2$) | Die line (number/m) | Back sheet performance Adhesion (%) | Hydrolysis resistance (%) | Remarks |
|---|---|---|---|---|---|---|---|---|---|---|---|
| B-1 | PET-1 | 300 | 0.07 | 0.004 | 15 | 0.66 | 0 | 0 | 35 | 82 | Comp. Ex. |
| A-1 | PET-1 | 300 | 0.09 | 0.005 | 14 | 0.67 | 0 | 0 | 10 | 83 | Present invention |
| A-2 | PET-1 | 300 | 0.13 | 0.007 | 16 | 0.68 | 0 | 0 | 5 | 82 | Present invention |
| A-3 | PET-1 | 300 | 0.15 | 0.03 | 15 | 0.67 | 0 | 0 | 0 | 82 | Present invention |
| A-4 | PET-1 | 300 | 0.19 | 0.15 | 14 | 0.68 | 0 | 0 | 4 | 81 | Present invention |
| A-5 | PET-1 | 300 | 0.23 | 0.20 | 15 | 0.66 | 0 | 0 | 9 | 82 | Present invention |
| B-2 | PET-1 | 300 | 0.28 | 0.22 | 16 | 0.68 | 0 | 0 | 40 | 83 | Comp. Ex. |
| B-3 | PET-2 | 250 | 0.08 | 0.007 | 1 | 0.72 | 0 | 0 | 31 | 80 | Comp. Ex. |
| A-6 | PET-2 | 250 | 0.12 | 0.01 | 2 | 0.70 | 0 | 0 | 11 | 82 | Present invention |
| A-7 | PET-2 | 250 | 0.14 | 0.04 | 4 | 0.71 | 0 | 0 | 3 | 83 | Present invention |
| A-8 | PET-2 | 250 | 0.16 | 0.06 | 10 | 0.72 | 0 | 0 | 0 | 82 | Present invention |
| A-9 | PET-2 | 250 | 0.1 | 0.08 | 20 | 0.70 | 0 | 0 | 0 | 75 | Present invention |
| A-10 | PET-2 | 250 | 0.2 | 0.1 | 23 | 0.73 | 0 | 0 | 0 | 65 | Present invention |
| B-4 | PET-2 | 250 | 0.25 | 0.15 | 25 | 0.72 | 0 | 0 | 0 | 21 | Comp. Ex. |
| B-5 | PET-1 | 110 | 0.35 | 0.22 | 14 | 0.80 | 0 | 0 | 35 | 45 | Comp. Ex. |
| A-11 | PET-1 | 120 | 0.3 | 0.20 | 12 | 0.82 | 0 | 0 | 12 | 66 | Present invention |
| A-12 | PET-1 | 150 | 0.25 | 0.15 | 13 | 0.81 | 0 | 0 | 5 | 70 | Present invention |
| A-13 | PET-1 | 300 | 0.15 | 0.05 | 14 | 0.83 | 0 | 0 | 0 | 75 | Present invention |
| A-14 | PET-1 | 450 | 0.08 | 0.007 | 12 | 0.82 | 0 | 0 | 4 | 80 | Present invention |
| A-15 | PET-1 | 500 | 0.05 | 0.005 | 14 | 0.81 | 0 | 0 | 10 | 80 | Present invention |
| B-6 | PET-1 | 550 | 0.03 | 0.004 | 13 | 0.82 | 0 | 0 | 38 | 81 | Comp. Ex. |
| A-16 | PET-1 | 250 | 0.21 | 0.11 | 14 | 0.81 | 5 | 0 | 0 | 82 | Present invention |
| A-17 | PET-1 | 250 | 0.20 | 0.10 | 13 | 0.80 | 2 | 0 | 0 | 83 | Present invention |
| A-18 | PET-1 | 250 | 0.21 | 0.11 | 13 | 0.82 | 0 | 0 | 0 | 82 | Present invention |
| A-19 | PET-1 | 250 | 0.21 | 0.11 | 14 | 0.81 | 2 | 0 | 0 | 81 | Present invention |
| A-20 | PET-1 | 250 | 0.20 | 0.10 | 13 | 0.81 | 4 | 0 | 0 | 82 | Present invention |
| A-21 | PET-2 | 350 | 0.04 | 0.03 | 17 | 0.64 | 0 | 0 | 14 | 82 | Present invention |
| A-22 | PET-2 | 350 | 0.05 | 0.03 | 18 | 0.63 | 0 | 0 | 7 | 82 | Present invention |
| A-23 | PET-2 | 350 | 0.08 | 0.04 | 17 | 0.63 | 0 | 0 | 2 | 83 | Present invention |
| A-24 | PET-2 | 350 | 0.15 | 0.04 | 18 | 0.64 | 0 | 0 | 0 | 81 | Present invention |
| A-25 | PET-2 | 350 | 0.25 | 0.03 | 17 | 0.53 | 0 | 0 | 3 | 82 | Present invention |
| A-26 | PET-2 | 350 | 0.3 | 0.04 | 17 | 0.64 | 0 | 0 | 8 | 83 | Present invention |
| A-27 | PET-2 | 350 | 0.32 | 0.03 | 18 | 0.63 | 0 | 0 | 13 | 82 | Present invention |
| A-28 | PET-2 | 350 | 0.18 | 0.04 | 17 | 0.64 | 0 | 3 | 0 | 82 | Present invention |
| A-29 | PET-2 | 350 | 0.22 | 0.03 | 18 | 0.63 | 0 | 1 | 0 | 81 | Present invention |
| A-30 | PET-2 | 350 | 0.21 | 0.04 | 17 | 0.63 | 0 | 0 | 0 | 82 | Present invention |
| A-31 | PET-2 | 350 | 0.22 | 0.03 | 17 | 0.64 | 1 | 0 | 0 | 82 | Present invention |
| A-32 | PET-2 | 350 | 0.22 | 0.04 | 18 | 0.63 | 3 | 0 | 0 | 83 | Present invention |
| A-33 | PET-3 | 450 | 0.18 | 0.12 | 22 | 0.58 | 0 | 0 | 15 | 83 | Present invention |
| A-34 | PET-3 | 450 | 0.16 | 0.09 | 20 | 0.6 | 0 | 0 | 7 | 81 | Present invention |
| A-35 | PET-3 | 450 | 0.15 | 0.07 | 18 | 0.63 | 0 | 0 | 4 | 82 | Present invention |
| A-36 | PET-3 | 450 | 0.15 | 0.05 | 10 | 0.7 | 0 | 0 | 0 | 79 | Present invention |
| A-37 | PET-3 | 450 | 0.14 | 0.07 | 17 | 0.85 | 0 | 0 | 0 | 75 | Present invention |
| A-38 | PET-3 | 450 | 0.12 | 0.00 | 19 | 0.9 | 0 | 0 | 0 | 66 | Present invention |
| A-39 | PET-3 | 450 | 0.08 | 0.11 | 21 | 0.93 | 0 | 0 | 0 | 56 | Present invention |
| A-40 | PET-1 | 320 | 0.03 | 0.02 | 8 | 0.58 | 0 | 0 | 10 | 60 | Present invention |
| A-41 | PET-1 | 320 | 0.08 | 0.02 | 8 | 0.58 | 0 | 0 | 6 | 62 | Present invention |
| A-42 | PET-1 | 320 | 0.09 | 0.08 | 8 | 0.70 | 0 | 0 | 2 | 75 | Present invention |
| A-43 | PET-1 | 320 | 0.15 | 0.08 | 8 | 0.70 | 0 | 0 | 0 | 82 | Present invention |
| A-44 | PEN | 320 | 0.12 | 0.03 | 8 | 0.86 | 0 | 0 | 0 | 95 | Present invention |
| B-7 | PET* | 50 | 0.02 | 0.002 | 25 | 0.62 | 2 | 0 | 50 | 38 | Comp. Ex.* |
| A-45 | PET-1 | 300 | 0.17 | 0.06 | 15 | 0.78 | 0 | 0 | 0 | 0 | Present invention |
| B-8 | LUMIRROR | 50 | 0.26 | 0.15 | 35 | 0.63 | 0 | 0 | 45 | 32 | Comp. Ex.** |
| A-46 | PET-1 | 300 | 0.17 | 0.06 | 15 | 0.78 | 0 | 0 | 0 | 0 | Present invention |
| B-9 | PET-1 | 100 | 0.28 | 0.18 | 28 | 0.62 | 0 | 0 | 42 | 41 | Comp. Ex. |
| A-47 | PET-1 | 300 | 0.17 | 0.06 | 15 | 0.78 | 0 | 0 | 0 | 0 | Present invention |
| A-48 | PET-4 | 300 | 0.16 | 0.05 | 10 | 0.71 | 0 | 0 | 0 | 90 | Present invention |

Comp. Ex. * (PET*): According to Example 1 of Patent Document 1 (JP-A No. 2007-268710)
Comp. Ex. **: According to Patent Document 2 (JP-A No. 2003-60218)

As shown in Tables 1 and 2, Examples were excellent in hydrolysis resistance and had favorable adhesion to the adherend compared with Comparative Examples.

The PET film B-7 for comparison in Table 2 above is an embodiment according to Example 1 described in JP-A No. 2007-268710 and the PET film A-45 of the invention is an embodiment according to the invention corresponding thereto. More specifically, in the PET films B-7 and A-45, the coating liquid A described in Paragraphs [0036] to [0038] of JP-A No. 2007-268710 is applied in place of the coating liquid for undercoat layer described above. These films were all excellent in adhesion after 85° C. and 85% RH for 1000 hours and immediately after the application, but when the films were exposed to severe environmental conditions of 120° C. and 100% RH for 100 hours, poor adhesion occurred in the PET film B-7 for comparison.

The PET film B-8 for comparison is an embodiment according to Example 1 of JP-A No. 2003-60218 and the PET film A-46 of the invention is an embodiment according to the invention corresponding thereto. More specifically, in the PET films B-8 and A-46, a styrene olefin copolymer resin "ARON MELT" is applied in place of the coating liquid for the undercoat layer described above according to the description of Paragraph [0044] of JP-A No. 2003-60218. For the Comparative Example, a white PET film (LUMIRROR TYPE E20 (trade name), manufactured by Toray Industries. Inc., Thickness of 50 μm) was used as a polyester film according to the description of Example 1 of the publication. Also in the comparison here, poor adhesion occurred in the PET film B-8 for comparison under severe thermal treatment conditions (120° C. and 100% RH for 100 hours).

The PET film B-9 for comparison is an embodiment in which adhesion was performed by corona treatment. The corona treatment was carried out at 25 W·min/m$^2$ using a corona discharge treatment device HF-802 (trade name) manufactured by KASUGA ELECTRIC WORKS, LTD. The PET film A-47 of the invention is an embodiment according to the invention corresponding thereto, in which the corona treatment was not carried out. The (i) to (v) layers were formed by coating thereon. When these films were exposed to severe thermal treatment conditions of 120° C. and 100% RH for 100 hours, the adhesion was favorable in the PET film A-47 of the invention but poor adhesion occurred in the PET film B-9 for comparison.

Example 2

A back sheet was produced, a solar cell module was produced, and then evaluation was performed in the same manner as in Example 1, except changing the reflective layer, the adhesion layer, the undercoat layer, and the antifouling layer formed on the sample film in Example 1 to the layers shown below, respectively.

Also in this Example, the same results as those in Example 1 were obtained, and the hydrolysis resistance and the adhesion to each layer were excellent.

(i) Reflective Layer (White Layer)

A white coating material (W43NTM (trade name), manufactured by TOYO INK MFG. CO., LTD.) was used in place of the coating liquid for forming a reflective layer of Example 1, and was applied using a gravure coater so that the coating amount was 5 g/m$^2$. Thereafter, the coating film was dried at 160° C. for 5 minutes to form a reflective layer (white layer).

(ii) Adhesion Layer

A coating liquid was prepared by the same method as the method for the coating agent A described in Paragraphs [0036] to [0039] (Example 1) of JP-A No. 2007-268710. The coating liquid was used in place of the adhesion layer coating liquid of Example 1. The coating liquid was applied by bar coating onto the reflective layer to form an adhesion layer by coating. The layer was dried at 180° C., so that the layer thickness after drying was 2 μm.

(iii) Undercoat Layer

Acryl polyol (hydroxyethyl methacrylate polymer) and tolylene diisocyanate were added so that the NCO groups were equivalent to the OH groups of the acryl polyol, and then were diluted with ethyl acetate so that the total solid content was 5% by mass. With the resultant, further, UVINUL 3039 (trade name, manufactured by BASF A.G.) as a UV absorber was mixed so that the solid content concentration was 4% by mass, thereby preparing a coating liquid. The coating liquid was applied using a gravure coating device so that dry layer thickness was 0.1 μm, whereby an undercoat layer was formed.

(v) Antifouling Layer

An antifouling layer coating liquid having the following composition was prepared. An antifouling layer was formed by coating on the barrier layer using the antifouling layer coating liquid in place of the first antifouling layer coating liquid and the second antifouling layer coating liquid of Example 1.

<Composition of Antifouling Layer Coating Liquid>

Curable fluororesin . . . 100 parts
(Copolymer of chlorotrifluoroethylene (CTFE)/vinyl ether/cured portion (hydroxyl group or carboxyl group) containing monomer)

2.4-tolylene diisocyanate (isocyanate curing agent) . . . 15 parts

Mineral spirit (solvent) . . . 50 parts

Silane coupling agent . . . 10 parts
(γ-glycidoxypropyltrimethoxysilane; additive agent)

UV absorber (TINUVIN 900) . . . 4 parts

Example 3

White Layer Effects

A back sheet was produced and evaluated in the same manner as in Example 1, except changing only the thickness of the white layer provided on the "PET film A-41" of Table 1 above as shown in Table 3 below in Example 1. As a comparison, the white layer was formed by coating also on the PET film B-1 for comparison of Table 1. The hydrolysis resistance and the adhesion were evaluated in the same manner as in Example 1 and the light scattering properties were measured according to the description of Paragraph [0046] of JP-A No. 2005-70253. The evaluation and measurement results are shown in Table 3 below.

TABLE 3

| | Film type of Table 1 | White layer thickness (μm) | Hydrolysis resistance (%) | Adhesion (%) | Light scattering properties (Spectral reflectance) (%) | Remarks |
|---|---|---|---|---|---|---|
| A-49 | A-41 | 0* | 50 | 25 | 60 | Present invention |
| A-50 | A-41 | 1 | 82 | 0 | 70 | Present invention |
| A-51 | A-41 | 2 | 83 | 0 | 80 | Present invention |
| A-52 | A-41 | 4 | 82 | 0 | 85 | Present invention |
| A-53 | A-41 | 8 | 78 | 4 | 90 | Present invention |
| A-54 | A-41 | 10 | 75 | 5 | 95 | Present invention |
| A-55 | A-41 | 12 | 55 | 20 | 95 | Present invention |
| A-56 | A-41 | 6 | 85 | 0 | 88 | Present invention |
| B-8 | B-1 | 6 | 80 | 40 | 88 | Comparison |

*White PET film (LUMIRROR TYPE E20 (trade name), manufactured by Toray Industries. Inc., Thickness of 50 μm)

As shown in Table 3, the hydrolysis resistance tends to increase by providing the white layer. When the thickness of the white layer is more than 0 (zero) but 10 μm or lower, the adhesion is higher. More preferably, the thickness is more than 0 but 5 μm or lower. Also in the film type A-48 of Table 1 above, the same results as those of A-41 above were obtained.

Example 4

Barrier Layer Effects

In the "PET film A-41" of Table 1 above of Example 1, a barrier film was formed according to the description (Example) of Paragraphs [0067] to [0069] of JP-A No. 2009-90634. In the process, the barrier layer shown in Table 4 below was given by adjusting the thickness of "inorganic layer." The hydrolysis resistance was evaluated in the same manner as in Example 1 and the moisture permeability was measured according to the description of Paragraph [0075] of JP-A No. 2009-90634. Also in the film type A-48 of Table 1 above, the same results as those of A-41 above were obtained.

TABLE 4

|  | Film type of Table 1 | Moisture permeability (g/m² · day) | Hydrolysis resistance (%) | Deformations (/m²) | Remarks |
|---|---|---|---|---|---|
| A-57 | A-41 | $10^1$ | 82 | 0 | Present invention |
| A-58 | A-41 | $10^0$ | 85 | 0 | Present invention |
| A-59 | A-41 | $10^{-1}$ | 86 | 0 | Present invention |
| A-60 | A-41 | $10^{-3}$ | 87 | 0 | Present invention |
| A-61 | A-41 | $10^{-5}$ | 87 | 0 | Present invention |
| A-62 | A-41 | $10^{-6}$ | 87 | 0 | Present invention |
| A-63 | A-41 | $10^{-7}$ | 87 | 3 | Present invention |

The polyester film of the invention is preferably used for the application of a back sheet (a sheet disposed on a side opposite to the sunlight incidence side with respect to a solar cell device; a so-called back sheet) for constituting a solar cell module, for example.

All publications, patent applications, and technical standards mentioned in this specification are herein incorporated by reference to the same extent as if each individual publication, patent application, or technical standard was specifically and individually indicated to be incorporated by reference.

What is claimed is:

1. A polyester film comprising terminal carboxylic groups in an amount of from 2 eq/t to 23 eq/t, wherein an amount of carboxylic groups on a surface of the film is from 0.005 eq/m² to 0.2 eq/m², and a thickness of the film is from 120 μm to 500 μm.

2. The polyester film according to claim 1, wherein an amount of hydroxyl groups on the surface of the film is from 0.05 eq/m² to 0.3 eq/m².

3. The polyester film according to claim 1, wherein an intrinsic viscosity (IV) of the film is from 0.60 to 0.90.

4. The polyester film according to claim 1, wherein the thickness of the film is from 200 μm to 400 μm.

5. The polyester film according to claim 1, further comprising titanium atoms in an amount of from 1 ppm to 30 ppm.

6. The polyester film according to claim 1, further comprising at least one white layer having a thickness of from 1 μm to 10 μm formed on said polyester film.

7. The polyester film according to claim 6, further comprising, on the white layer, at least one adhesion layer exhibiting adhesion to an adherend containing an ethylene-vinyl acetate copolymer formed on said polyester film.

8. The polyester film according to claim 1, further comprising at least one inorganic layer having a moisture permeability of from $10^{-6}$ g/m²·d to 1 g/m²·d formed on said polyester film.

9. The polyester film according to claim 8, wherein the inorganic layer is a vapor deposition film formed by vacuum deposition.

10. The polyester film according to claim 1, further comprising at least one layer formed on said polyester film selected from the group consisting of a fluororesin layer having a thickness of from 1 μm to 10 μm and a silicon resin layer having a thickness of from 1 μm to 10 μm.

11. The polyester film according to claim 6, wherein the white layer is formed by coating.

12. A solar cell module comprising the polyester film according to claim 1.

13. A method for manufacturing a polyester film, comprising:
    solid-phase polymerizing a polyester; and
    melting and kneading the solid-phase polymerized polyester and then extruding the polyester from a die, thereby forming a polyester film containing terminal carboxylic groups in an amount of from 2 eq/t to 23 eq/t, wherein an amount of carboxylic groups on a surface of the film is from 0.005 eq/m² to 0.2 eq/m², and a thickness of the film is from 120 μm to 500 μm.

14. The method for manufacturing a polyester film according to claim 13, further comprising, before the solid phase polymerization, synthesizing the polyester by carrying out an esterification reaction of a dicarboxylic acid or an ester derivative thereof and a diol compound in the presence of a titanium catalyst.

15. The method for manufacturing a polyester film according to claim 14, wherein the synthesis of the polyester is performed in the presence of the titanium catalyst in an amount that corresponds to an amount of titanium atoms of from 1 ppm to 30 ppm.

* * * * *